(12) United States Patent
Intrater et al.

(10) Patent No.: US 10,031,869 B1
(45) Date of Patent: Jul. 24, 2018

(54) CACHED MEMORY STRUCTURE AND OPERATION

(71) Applicant: Adesto Technologies Corporation, Sunnyvale, CA (US)

(72) Inventors: Gideon Intrater, Sunnyvale, CA (US); Bard Pedersen, Fremont, CA (US); Paul Hill, Eastleigh (GB)

(73) Assignee: Adesto Technologies Corporation, Santa Clara, CA (US)

(*) Notice: Subject to any disclaimer, the term of this patent is extended or adjusted under 35 U.S.C. 154(b) by 45 days.

(21) Appl. No.: 14/665,831

(22) Filed: Mar. 23, 2015

Related U.S. Application Data

(60) Provisional application No. 61/971,595, filed on Mar. 28, 2014.

(51) Int. Cl.
| | |
|---|---|
| *G06F 12/00* | (2006.01) |
| *G06F 13/00* | (2006.01) |
| *G06F 13/28* | (2006.01) |
| *G06F 13/16* | (2006.01) |
| *G06F 12/122* | (2016.01) |
| *G11C 11/406* | (2006.01) |
| *G11C 7/10* | (2006.01) |
| *G06F 12/0831* | (2016.01) |
| *G06F 12/0802* | (2016.01) |
| *G06F 12/0868* | (2016.01) |

(52) U.S. Cl.
CPC ...... *G06F 13/1673* (2013.01); *G06F 12/0831* (2013.01); *G06F 12/122* (2013.01); *G11C 7/1063* (2013.01); *G11C 7/1072* (2013.01); *G11C 11/40615* (2013.01); *G06F 12/0802* (2013.01); *G06F 12/0868* (2013.01); *G06F 2212/621* (2013.01); *G06F 2212/69* (2013.01)

(58) Field of Classification Search
CPC .................. G06F 12/0802; G06F 12/0868
USPC .................................... 711/105, 118
See application file for complete search history.

(56) References Cited

U.S. PATENT DOCUMENTS

| | | | |
|---|---|---|---|
| 6,704,835 B1 | 3/2004 | Garner | |
| 8,688,897 B2 | 4/2014 | Eleftheriou et al. | |
| 2001/0030890 A1* | 10/2001 | Yamagami | G06F 3/0601 365/185.09 |
| 2002/0013874 A1* | 1/2002 | Gelke | G06F 13/4018 710/305 |
| 2002/0029312 A1* | 3/2002 | Zager | G06F 12/0864 711/3 |
| 2004/0153610 A1* | 8/2004 | Chi | G06F 12/0859 711/144 |
| 2004/0252202 A1* | 12/2004 | Silverstein | H04N 9/045 348/222.1 |

(Continued)

*Primary Examiner* — Edward Dudek, Jr.
*Assistant Examiner* — Sidney Li
(74) *Attorney, Agent, or Firm* — Michael C. Stephens, Jr.

(57) ABSTRACT

In one embodiment, a cached memory device can include: (i) a memory array coupled to a system address bus and an internal data bus; (ii) a plurality of data buffers coupled to a system data bus, and to the memory array via the internal data bus; (iii) a plurality of valid bits, where each valid bit corresponds to one of the data buffers; (iv) a plurality of buffer address registers coupled to the system address bus, where each buffer address register corresponds to one of the data buffers; and (v) a plurality of compare circuits coupled to the system address bus, where each compare circuit corresponds to one of the data buffers.

20 Claims, 21 Drawing Sheets

(56) References Cited

U.S. PATENT DOCUMENTS

| | | |
|---|---|---|
| 2005/0195635 A1 | 9/2005 | Conley et al. |
| 2006/0005047 A1* | 1/2006 | Lekatsas ............. G06F 12/0875 713/193 |
| 2006/0072369 A1* | 4/2006 | Madter ............... G06F 12/0804 365/232 |
| 2007/0050592 A1* | 3/2007 | Gschwind ........... G06F 9/30036 711/201 |
| 2011/0082967 A1 | 4/2011 | Deshkar et al. |
| 2012/0182795 A1* | 7/2012 | Estakhri ................... G11C 8/04 365/171 |
| 2012/0295398 A1* | 11/2012 | Kurunczi ............. H01L 45/165 438/104 |

* cited by examiner

US 10,031,869 B1

CACHED MEMORY STRUCTURE AND OPERATION

RELATED APPLICATIONS

This application claims the benefit of U.S. Provisional Application No. 61/971,595, filed Mar. 28, 2014, and which is incorporated herein by reference in its entirety.

FIELD OF THE INVENTION

The present invention generally relates to the field of semiconductor devices. More specifically, embodiments of the present invention pertain to flash memory devices, cache memory, sensor hubs, resistive random-access memory (ReRAM), and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies that include resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

In one embodiment, a cached memory device can include: (i) a memory array coupled to a system address bus and an internal data bus; (ii) a plurality of data buffers coupled to a system data bus, and to the memory array via the internal data bus; (iii) a plurality of valid bits, where each valid bit corresponds to one of the data buffers; (iv) a plurality of buffer address registers coupled to the system address bus, where each buffer address register corresponds to one of the data buffers; and (v) a plurality of compare circuits coupled to the system address bus, where each compare circuit corresponds to one of the data buffers.

In one embodiment, a method of controlling a write operation in a cached memory device, can include: (i) comparing a system address bus against a plurality of buffer address registers, where each buffer address register corresponds to one of a plurality of data buffers; (ii) selecting one of the data buffers in response to a hit from the comparing; (iii) allocating a data buffer as the selected buffer in response to all misses from the comparing; (iv) writing data from a system data bus to the selected data buffer; and (v) writing the data previously written into the selected data buffer to a memory array via an internal data bus.

In one embodiment, a method of controlling a read operation in a cached memory device, can include: (i) comparing a system address bus against a plurality of buffer address registers, where each buffer address register corresponds to one of a plurality of data buffers; (ii) selecting one of the data buffers in response to a hit from the comparing; (iii) determining if valid/dirty bits are set for the selected data buffer; (iv) reading data from the selected data buffer onto a system data bus if the valid/dirty bits are set; and (v) reading data from the memory array via the internal data bus in response to at least one of: all misses from the comparing, and the valid/dirty bits being reset.

DETAILED DESCRIPTION OF EMBODIMENTS

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device, and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Example CBRAM Cell Structure and Architecture

Particular embodiments may be directed to resistive switching memories (e.g., conductive bridging random-access memory [CBRAM], resistive RAM [ReRAM], etc.). The invention, in its various aspects, will be explained in greater detail below with regard to exemplary embodiments. Particular embodiments can include structures and methods of operating resistive switching memories that can be programmed/written and erased between one or more resistance and/or capacitive states. Resistive switching memory devices can include a plurality of resistive memory cells with "programmable impedance elements" or any type of resistive switching or resistance-change memory cells or elements.

Figure 1:
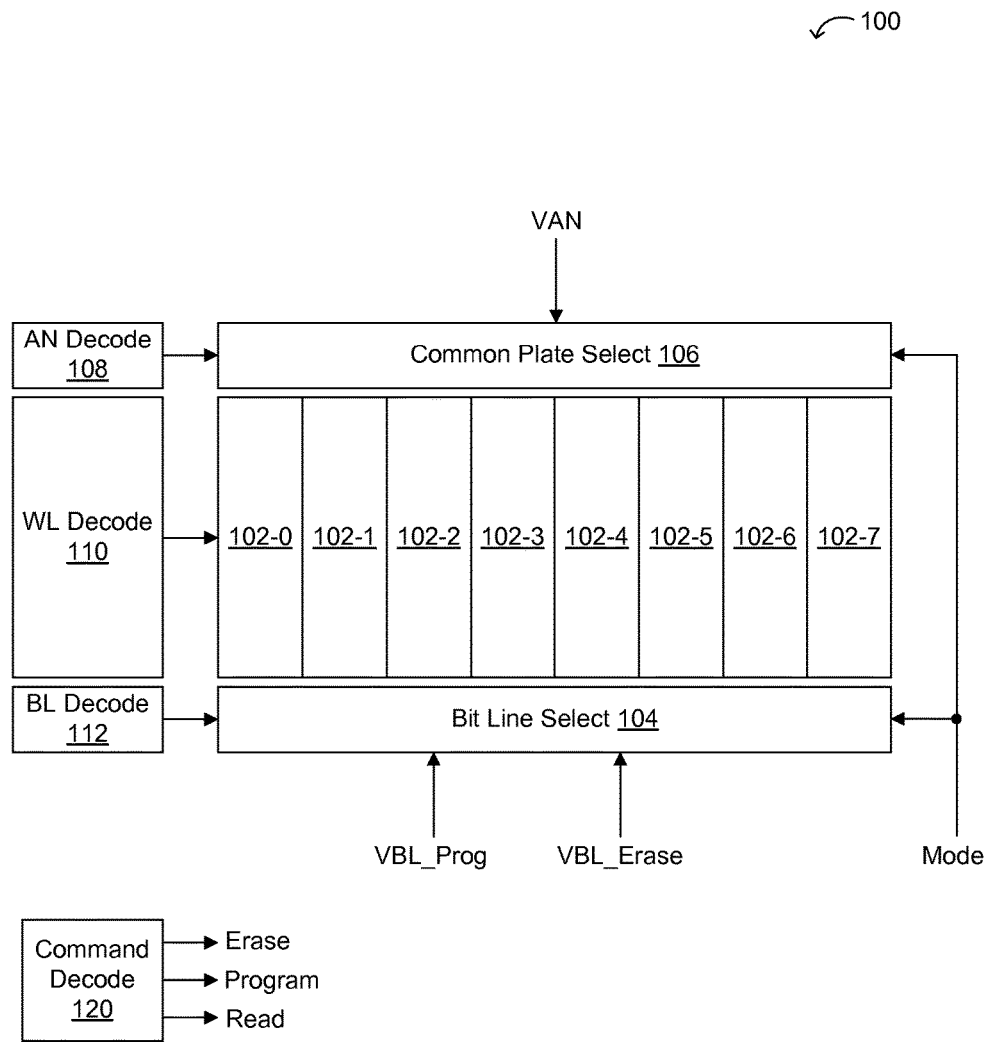
FIG. 1 is an example memory device arrangement.
Figure 2:
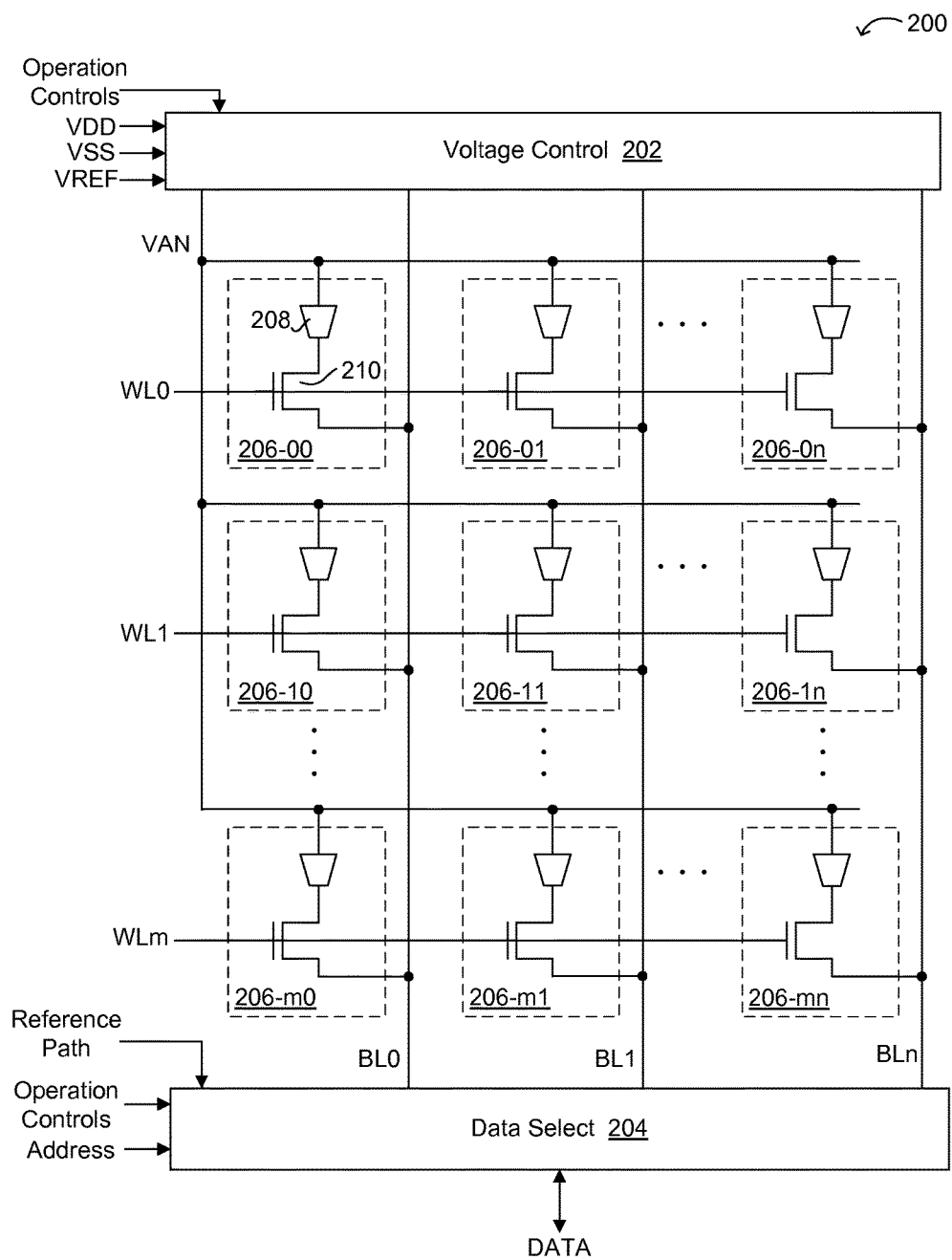
FIG. 2 is a schematic block diagram of an example common anode array structure.

FIGS. 1 and 2 show example memory architectures and circuit structures that can utilize programmable impedance elements. However, particular embodiments are amenable to a wide variety of memory architectures, circuit structures, and types of resistive switching memories.

Referring now to FIG. 1, an example memory device is shown and designated by the general reference character 100. A memory device 100 can include common anode sectors 102-0 to 102-7, bit line selection circuitry 104, common plate selection circuitry 106, anode decoding circuitry 108, word line decoding circuitry 110, and bit line decoding circuitry 112. A memory device 100 can be a single integrated circuit, or may form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

Common anode sectors (102-0 to 102-7) can each include a number of memory cells arranged into one or more columns and multiple rows, and coupled to a common anode plate. Each memory cell can include one or more programmable impedance elements or CBRAM storage elements, and a selection device. Generally, a CBRAM storage element may be configured such that when a bias greater than a threshold voltage is applied across electrodes of the CBRAM storage element, the electrical properties of the CBRAM storage element can change. For example, in some arrangements, as a voltage is applied across the electrodes of the CBRAM storage element, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

Voltages VBL_Prog, VBL_Erase, and VAN may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a CBRAM cell by applying suitable voltages across the electrodes thereof.

Bit line selection circuitry 104 can selectively connect bit lines of one or more common anode sections (102-0 to 102-7) according to a mode of operation and bit line decoding values. In one particular example, bit line selection circuitry 104 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Common plate selection circuitry 106, can connect anode plates to an inhibit voltage for CBRAM cells that are not selected (e.g., via anode decode 108) for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected CBRAM device can be switched between program and erase operations. In this way, program and erase can be "symmetric" operations. That is, in a programming operation, a CBRAM cell to be programmed can be connected between suitable voltages (e.g., V1-V2) in an anode-to-cathode direction. In an erase operation, a CBRAM cell to be erased can be connected between suitable voltages (e.g., V2-V1) in a cathode-to-anode direction.

Bit line decoding circuitry 112 can generate values for selecting given bit lines for read, program, and erase operations. In one arrangement, in response to address information (e.g., column address data), bit line decoding circuitry 112 can generate bit line select signals for application to bit line select circuitry 104. Word line decoding circuitry 110 can generate values for selecting a given set of memory cells by enabling access devices in one or more selected rows of common anode sections (102-0 to 102-7). In response to address information (e.g., row address data), one or more word lines can be driven to a select voltage to thereby enable the corresponding select device (e.g., a transistor) in a row of memory cells.

Referring now to FIG. 2, shown is a schematic block diagram of an example common anode array structure 200, which can be one implementation of the example shown in FIG. 1. In this example, voltage control 202 can receive various supply voltages (e.g., VDD, VSS, VREF, etc.), as well as operation controls (e.g., program, erase, verify, read, etc.). Resistive memory cells 206 can include a programmable impedance element 208 and an access transistor 210, as shown. In this particular arrangement, the anode of each memory cell 206 can connect together in a common anode structure. For example, the common anode can be a large plate structure that may be biased at a voltage VAN generated by voltage control 202. Of course, other voltage generation control and regulated levels, as discussed above, can be utilized in certain embodiments.

In this example, data select 204 can provide an interface between the bit lines (BL0, BL1, . . . BLn) and a data path that is coupled to a sensing or amplification block, as well as to write circuitry. Address decoding can be used to determine which of the bit lines are mapped to the data lines in a particular access cycle. Other types of addressing or decoding (e.g., anode-based decoding) can also be employed. For example, the common anode structure as shown can be broken up into a plurality of sub blocks of common anodes, and each of these may be addressed and decoded. In addition, word line (WL0, WL1, . . . WLm) decoding can be utilized for activation of the appropriate word line for a given cycle.

Further, a reference path can also be coupled to data select 204. The reference path can be used by a sensing circuit in order to compare against a regular bit line. For example, a current from a selected bit line and its selected memory cell 206 can be compared against a current from a reference bit line, where the reference bit line is biased such that appropriate data states on the selected memory cell via the selected bit line can be detected. In one application, the capacitance on the reference bit line and reference memory cell structure can match the capacitance on a regular memory cell/bit line such that these effects are negated during the sensing process.

Other architectures can also be employed with sensing circuitry, arrangements, and methods of particular embodiments. For example, a common cathode structure, whereby a plurality of memory cells are coupled together via a common cathode connection, can be supported. In such a case, the access transistor may connect the anode to the corresponding bit line in a bit line anode arrangement. Also, cathode-based decoding can be used in such an arrangement. Another example architecture or memory cell arrangement is a strapped source structure. In any event, particular embodiments are suitable to a wide variety of resistive memory cell architectures and arrangements.

Data select 204 can also receive operation control signals. These signals can be used to set a read data path, a write data path, and sensing circuitry, as appropriate for the given command. For example, a read data path may be activated for a read operation, a program verify operation, or an erase verify operation. Also, a write data path may be activated for a program or erase operation. For example, a common bidirectional sensing circuit can be employed in each of these operations. In particular, the bidirectional sensing circuit can allow for a program verify to be performed using a same forward bias (anode voltage higher with respect to cathode voltage) on the memory cell as was used to program the memory cell. Similarly, the bidirectional sensing circuit can allow for an erase verify to be performed using a same reverse bias (cathode voltage higher with respect to anode voltage) on the memory cell as was used to erase the memory cell.

Sensing circuits in particular embodiments also aim to minimize disturbance of the accessed cell resistance during the read operation to determine a data state from that cell. Thus, a cell that is programmed (e.g., in a data state "0") should remain in that state after a program verify or standard read operation, and a cell that is erased (e.g., in a data state "1") should remain in that state after an erase verify or standard read operation. The CBRAM cell may generally be programmed with a forward bias voltage (positive with respect to anode and cathode), and may be erased with a reverse bias voltage (negative with respect to anode and cathode). Various voltages for bit lines and the common anode plate can be supported in particular embodiments. Voltages can also be changed depending on the bias direction (forward or reverse) for a read operation.

Having described the various sections of FIG. 2, one example of the operation of such a memory device will now be described with reference to an operation that accesses memory cell 206-00. Initially, word lines WL0, WL1, . . . WLm can be driven to a de-select voltage (e.g., low) by associated word line drivers. Bit line selection circuitry 104 can place bit lines BL0 and BL1 in the de-selected state. Similarly, common plate selection circuitry 106 can place common anode plates in the de-select state.

In a program operation, in response to address and mode data, bit line selection signals can be used to connect a selected bit line to read/write control circuitry via data select 204. In contrast, other bit lines can be de-selected, and thus placed in the de-selected state. Mode selection values can result in read/write control circuitry connecting the selected bit line (e.g., BL0) to a cathode program voltage. A program operation can also include anode plate voltage VAN being connected to a program voltage, while connecting the selected bit line is grounded. A word line driver corresponding to the selected memory cell can be driven to a select voltage, thereby placing the selected memory cell between suitable programming voltages.

An erase operation can occur in the same general fashion, but with the erase voltage being applied to the selected bit line and common anode voltage VAN. As noted in the example of FIG. 1, in particular embodiments, such an operation can be symmetrical. Also, while FIG. 2 shows n-channel MOS transistors 210 as access devices, other embodiments may include different types of access devices. In such alternate embodiments, associated word line drivers would provide appropriate voltage and/or currents to enable such access devices. In this way, bit line selection, anode plate selection, and word line activation can be utilized to program and/or erase a CBRAM array having bit lines connected to cathodes of CBRAMs within multiple memory cells.

While particular example architectures and circuits suitable for CBRAMs, and memory arrays formed thereof, with respect to FIGS. 1 and 2, programmable impedance elements in certain embodiments are suitable to a wide variety of architectures and/or circuit arrangements.

Figure 3:
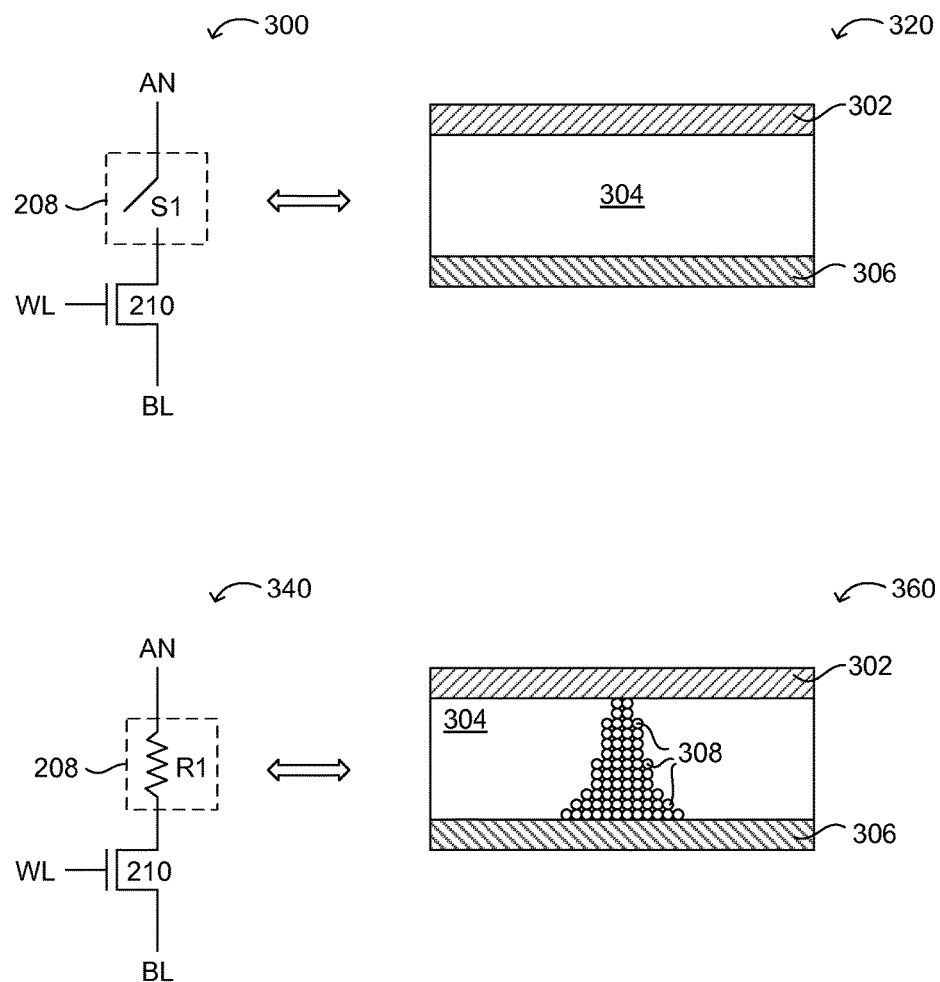
FIG. 3 is a diagram of an example programmable impedance element with schematic modeling.

Referring now to FIG. 3, shown is a diagram of an example programmable impedance element with schematic modeling. For example, example 300 shows a memory cell with an open switch 51 representation of programmable impedance element 208. The programmable impedance element or CBRAM storage element portion of this representation corresponds to the cross-section diagram 320, which represents a resistive storage element in a high impedance state (e.g., data state "1"), or an erased state. Particular embodiments can also include any type of resistive switching or resistance-change memory cells or elements. In one example, CBRAM storage element 320 can include electrochemically active electrode 302, solid electrolyte 304, and inert electrode 306. The example CBRAM storage element 320 may represent a strong or substantially erased state of the cell. As shown, substantially no conductive path between active electrode 302 and inert electrode 306 is seen in CBRAM storage element 320.

Schematic representation 340 and corresponding cross-section diagram 360 show examples of CBRAM storage element 208 in a low impedance state (e.g., data state "0"), or a programmed state. For example, example 340 shows a memory cell with a resistor R1 or closed switch representation of CBRAM storage element 208. The CBRAM storage element portion of this representation corresponds to the cross-section diagram 360. In the example 360, electrodeposits 308 can form in solid electrolyte 304 to form a "bridge" or conductive path between electrochemically active electrode 302 and inert electrode 306 to program the memory cell. For example, electrodeposits 308 can be from active electrode 302, and may include silver, copper, titanium, or tellurium, as just a few examples. As shown in example CBRAM storage element 360, a full conductive path may be formed between active electrode 302 and inert electrode 306 by electrodeposits 308.

As shown in examples 300 and 340, a control transistor (e.g., 210) can also be included in each memory cell including the programmable impedance element or CBRAM storage element 208. For example, transistor 210 can be controlled by a word line, as discussed above with respect to FIG. 2. Transistor 210 may be an access transistor to allow CBRAM storage element 208 to be programmed, read, and erased.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a CBRAM storage element may be substantially symmetric to a program operation.

Example Cached Memory Structure and Operation

Cache memory can be utilized along with a main or larger memory in order to improve operating performance, among other considerations. Memory arrays (e.g., flash or other non-volatile memory arrays) and/or devices may avoid having to upgrade to a more expensive associated microcontroller unit (MCU) or central processing unit (CPU) by integrating SRAM memories as a cache within the device. Such integration can also allow for avoidance of fitting or other procurement of relatively expensive external SRAM devices. This type of integration may also free up critical MCU Embedded SRAM space by allocating some of this memory space to the memory device, as opposed to the MCU device. For example, data may be temporarily offloaded from RAM found on the MCU device to a flash RAM device, which can improve operation for some applications.

Various arrangements and examples of "flash" memory arrays and SRAM-based buffering or caching are described herein. However, particular embodiments may be suitable to a wide variety of memory combinations, such as any relatively slow memory (volatile or non-volatile) as a memory array, and any relatively fast memory (e.g., SRAM) as a buffer/cache memory. For example, the flash memory arrays as described herein can additionally or alternatively be implemented using CBRAM-based technology, such as discussed above. As such, a "flash memory array" can accommodate traditional flash technology, resistive switching memory (e.g., CBRAM) technology, etc., and a "buffer" can include a relatively fast memory technology (e.g., SRAM).

Figure 4:
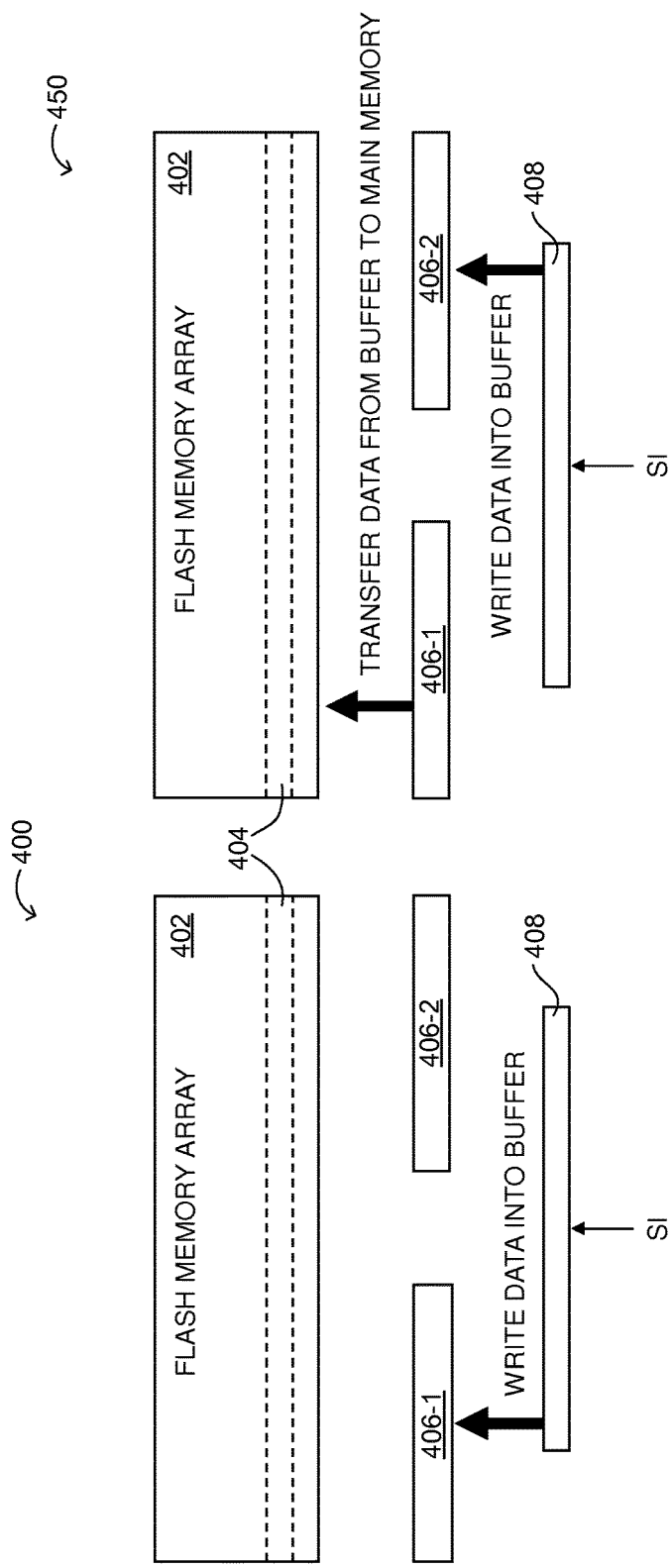
FIG. 4 is a schematic block diagram of an example flash memory with internal SRAM buffers, in accordance with embodiments of the present invention.

Referring now to FIG. 4, shown is a schematic block diagram of an example flash memory with internal SRAM buffers, in accordance with embodiments of the present invention. This particular example structure may be suitable for data streaming, as well as for quickly writing relatively large blocks of code and/or data. As shown in examples 400 and 450, I/O interface 408 (e.g., an SPI interface) can receive data for writing, such as from a serial interface (SI). In a first step as shown in diagram 400, data can be streamed from I/O interface 408 to buffer 406-1, and then writing (e.g., programming) of data from buffer 406-1 into flash memory array 402 (e.g., including page 404) can begin.

In a second step as shown in diagram 450, data can be streamed from I/O interface 408 to buffer 406-2, while writing/programming of buffer 406-1 to page 404 in flash memory array 402 occurs. For example, this process, including streaming of data from I/O interface 408 into buffer 406-2, and a next data page into buffer 406-1 (while data from buffer 406-2 is written into memory array 402) can be repeated. In this way, production costs can be reduced by improving programming time, and overall system operation can be improved through faster programming. In addition, less energy may be used, thus prolonging battery and/or super capacitor lifetime.

Flash with RAM writing (e.g., programming), as shown in this particular example, may utilize one or both buffers 406. For example, Table 1 below shows example programming speeds for these options, for programming with erase (e.g., the time to erase and program 4 kB, versus 1 kB), as well as for programming without erase.

TABLE 1

| | Dual buffer: | Single buffer: |
|---|---|---|
| Programming with erase | 86,200 us | 150,000 us |
| Programming without erase | 33,000 us | 85,500 us |

Figure 5:
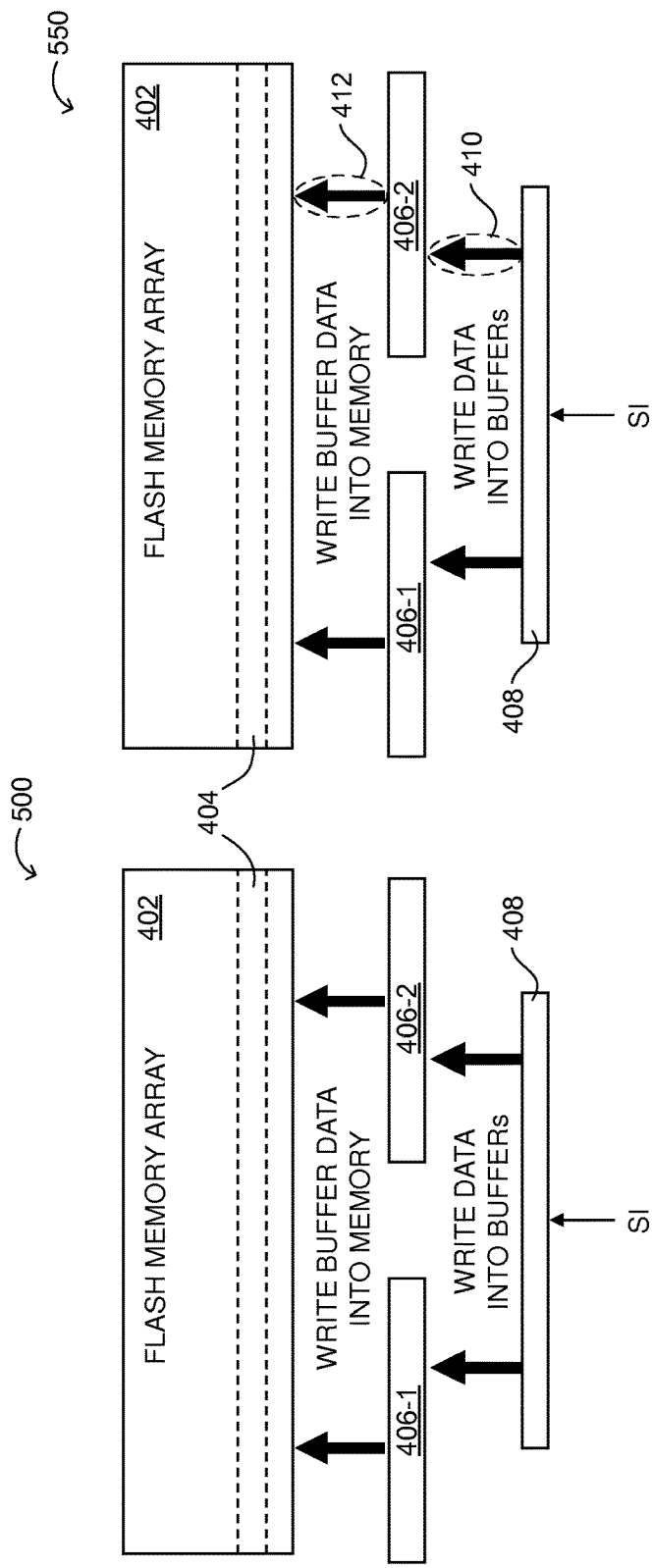
FIG. 5 is a schematic block and flow diagram of example endurance and power fail management enhancements for a flash memory with internal SRAM buffers, in accordance with embodiments of the present invention.

Referring now to FIG. 5, shown is a schematic block and flow diagram of example endurance and power fail management enhancements for a flash memory with internal SRAM buffers, in accordance with embodiments of the present invention. This approach can represent buffer dedication for data with different characteristics or purposes. In example 500, data from I/O interface 408 can be written into buffers 406-1 and 406-2 relatively frequently. For example, a write operation of 100 times to buffers 406, and once to flash memory array 402 may result in a 100:1 endurance improvement in some cases. For writing frequently into buffers 406-1 and 406-2, there may be no endurance limitations due to their SRAM implementation, less energy may be used, and faster operation can occur.

Data from buffers 406-1 and 406-2 can be written into memory array 402 on a relatively occasional or periodic basis. For writing data from buffers 406 on such an occasional basis into memory array 402, the number of program/erase cycles can be reduced, and the lifetime of memory array 402 may be extended (e.g., by fewer writes to a non-volatile array), as compared to a non-buffered approach. In addition, relatively complex software for wear-leveling and endurance enhancement algorithms can be substantially avoided in some cases. In this way, significant endurance enhancement can be achieved without associated CPU/MCU overhead.

Buffers 406-1 and 406-2 can also be dedicated for frequent or occasional writing. As shown in example 550, buffer 406-1 may be dedicated for frequent writing (e.g., programming), and buffer 406-2 may be dedicated for regular or periodic writing/programming via 410. Such an arrangement may be particularly useful for power fail management applications. For example, by using buffer 406-1 for frequent programming operations, there may be no endurance limitation as related to these operations, and less energy can be used, as compared to programming to flash memory array 402 every time.

This approach may also be much faster than writing to flash memory array 402 each time/cycle, thus allowing the associated CPU to shut down faster, such as in a power fail situation. Buffer 406-2 may be used for power fail data, and power fail data can be regularly (e.g., periodically) uploaded to buffer 406-2 via path 410. Buffer 406-2 writing/programming into flash memory array 402 via path 412 can be initiated (e.g., immediately) upon power fail detection. This approach can reduce CPU overhead in the event of a power fail situation. In this way, reduced system costs with a smaller battery and/or super capacitor, reduced CPU overhead, reduced power consumption, and improved system response times, can be achieved.

SRAM buffers 406 can thus be added to flash memory array 402. However, disadvantages of this particular example approach may include MCU firmware programmers needing to be aware at any given time of where the data resides (e.g., buffer 406-1, 406-2, or flash memory array 402). Also, an MCU firmware programmer may explicitly move data from buffers 406 to flash memory array 402. Also, if data is to be preserved across power down states for power cycles, the programmer may need to move data from buffers 406 before the power supply is removed, such as to accommodate when buffers 406 are implemented in volatile (e.g., SRAM) memory. However, in a cache-like buffer management, advantages of data buffers 406 can be maintained, housekeeping may be automatically performed, a streamlined programming model can be provided, and/or such buffer management may serve as a data movement engine for automatic wear-leveling.

Figure 6:
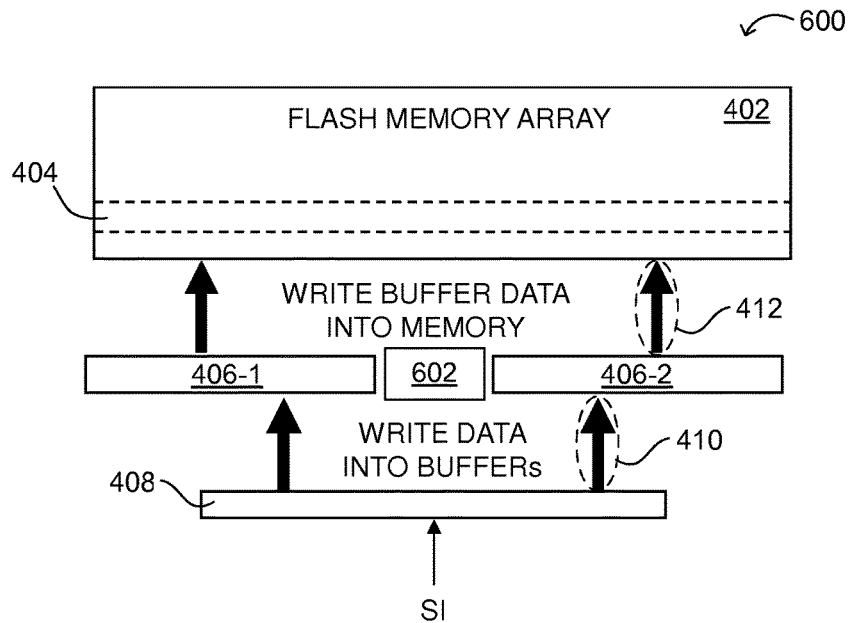
FIG. 6 is a schematic block diagram of a first example cached flash memory structure, in accordance with embodiments of the present invention.

Referring now to FIG. 6, shown is a schematic block diagram of a first example cached flash memory structure, in accordance with embodiments of the present invention. This example shown in 600 can support a streamlined programming model whereby housekeeping is performed without substantial intervention by the associated firmware. For example, N buffers 406 can be included on the same chip as flash memory array 402, where N>=2. As shown in example buffer attributes 650, each buffer can be augmented by a buffer address register (BAn), such as including upper address bits 652, that can hold the address of the page (e.g., page 404) into which the data may eventually be written in flash memory array 402. In addition, one or more "valid" bits 656 can correspond to the entire corresponding buffer. Also, valid bit Vn can be set if the data in buffer "n" is the most current data for the corresponding address range. Further, valid bits 656 can be utilized for certain of the read operation options.

Also as shown in example buffer attributes 650, one or more "dirty" bits 654 can correspond to each byte in the buffer. For example, for a page size of 32 bytes (B), each buffer may have a 32-bit vector Dn[0-31], and Dn[x] may be set if byte "x" in buffer "n" is more current than byte "x" in corresponding flash memory page 404. Also, a least recently used (LRU) field 658 may correspond to the entire buffer, and can be used for selecting a buffer for eviction through a least recently read buffer, least recently written buffer, a variant of these considerations, or any other suitable algorithm. Further, a programmable "lock" bit may be included as another attribute that may be utilized to exclude a particular buffer from eviction.

Whenever a write from the system (e.g., via the SI line of an SPI interface) occurs, the address can be compared against each of the buffer address (BA) registers. If there is a match for one of the buffers, the data can be written into the corresponding byte of that buffer 406 corresponding to the lower bits of the address, and the corresponding dirty bit may be set. If there is no match, a next "empty" buffer may be selected for write, the BA of that buffer can be set to the upper bits of the address, and if there were less than two "empty" buffers, one of the other buffers can be selected for eviction. The algorithm for selecting the buffer for eviction may be based on the LRU bits, random, or any other suitable approach.

Whenever eviction is required, the dirty bytes in the selected buffer can be written into flash memory array 402 (e.g., with a base address equal to the BA of that buffer 406), corresponding dirty and valid bits may be cleared, and the buffer's LRU may be updated. The writing/programming of strictly the dirty bytes into flash memory array 402 can be done in one of a few ways. For example, a read-modify-write operation can be employed, whereby the non-dirty bytes are read from flash memory 402 into a buffer 406, and then the full buffer data may be written into flash memory array 402. As another example, a selective write can be performed, whereby if bytes are to be selectively written to specific bytes the flash memory array, only these writes may be performed. Another approach is a combination of the above two methods for memory arrays where the write granularity is larger than a byte, but smaller than a page.

Whenever a read request from the system occurs, if the upper address bits match one of the BA registers, and either the valid bit is set or the byte-specific dirty bit is set, this can be indicated as a "hit." If there is a "hit" in one of the buffers 406, the data can be read from the byte of that buffer corresponding to the lower bits of the address. If there is no "hit," the data can be read from the byte of flash memory array 402 corresponding to the address. Alternatively, or in addition, the device may also read a full page 404 into the "empty" buffer 406, set the valid bit and the BA, and if there were less than two "empty" buffers, one of the other buffers can be selected for eviction. The algorithm for selecting the buffer for eviction may be based on the LRU bits, random, or any other suitable algorithm. Further, if the chip includes power down circuitry, upon detection of a loss of power and before the power goes completely away, write buffer (WB) control unit 602 can perform an evict operation on bytes that are "dirty."

In one embodiment, a cached memory device can include: (i) a memory array coupled to a system address bus and an internal data bus; (ii) a plurality of data buffers coupled to a system data bus, and to the memory array via the internal data bus; (iii) a plurality of valid bits, where each valid bit corresponds to one of the data buffers; (iv) a plurality of buffer address registers coupled to the system address bus, where each buffer address register corresponds to one of the data buffers; and (v) a plurality of compare circuits coupled to the system address bus, where each compare circuit corresponds to one of the data buffers.

Figure 7A:
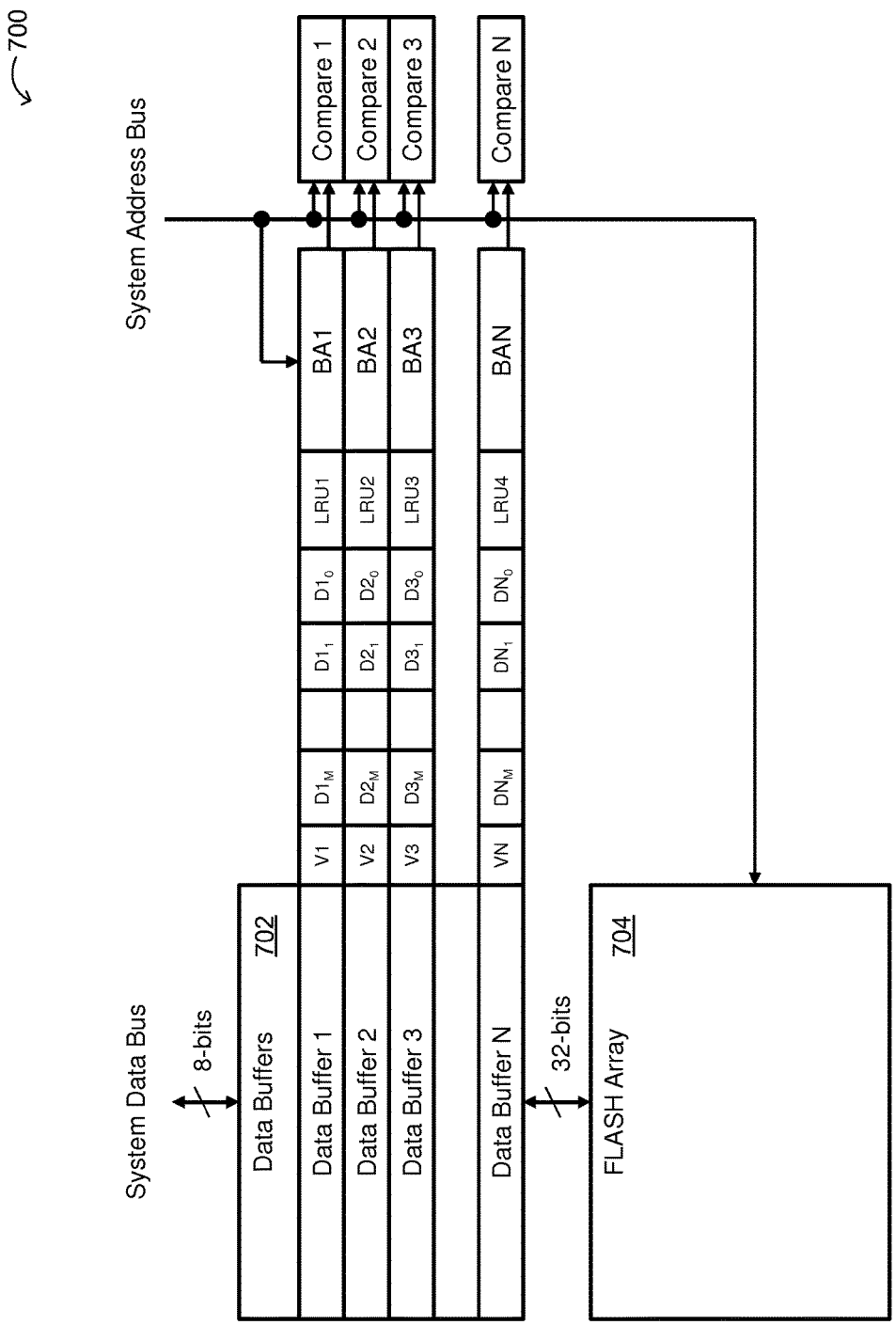
FIGS. 7A and 7B are schematic block diagrams of a second example cached flash memory structure, in accordance with embodiments of the present invention.
Figure 7B:
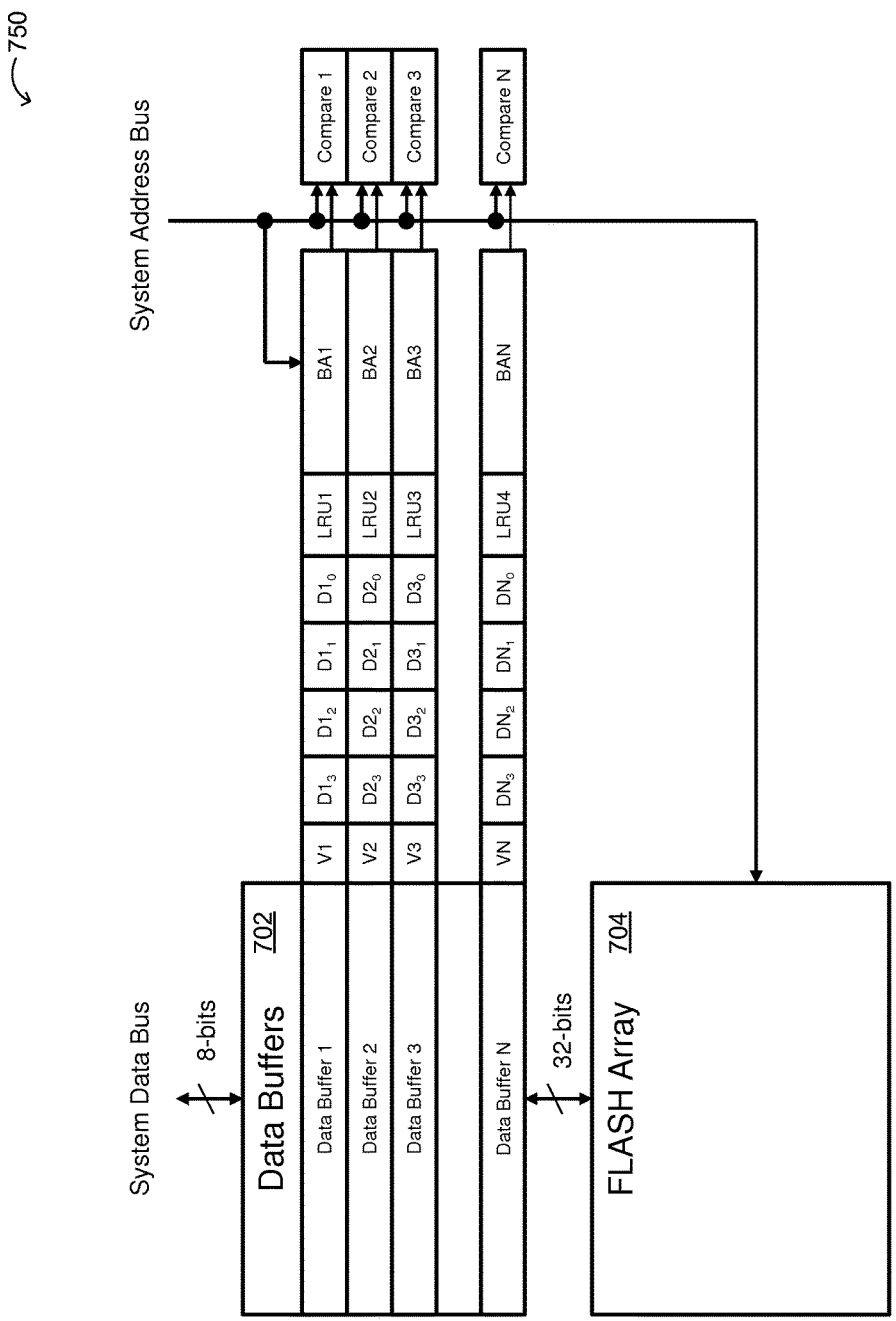

Referring now to FIGS. 7A and 7B, shown are schematic block diagrams 700/750 of a second example cached flash memory structure, in accordance with embodiments of the present invention. Note that data buffers 702 can be the same or similar to buffers 406 discussed above, and flash memory array 704 can be the same or similar to flash memory array 402 discussed above. Data buffers 702 can interface with flash memory array 704 via an internal data bus. A "dirty" bit (e.g., $D1_0$, $D1_1$, $D1_2$, and $D1_3$) can correspond to each byte in the corresponding buffer (e.g., data buffer 1 in data buffers 702). Data buffers 702 can include any number of data buffers (e.g., data buffer 1, data buffer 2, data buffer 3, . . . data buffer N). For example, for a page size of 4 bytes, each buffer may have a 4-bit vector Dn[0-3], and Dn[x] may be set if byte "x" in buffer "n" is more current than byte "x" in the corresponding flash memory array page of flash array 704. A buffer may be considered as "empty" if all the dirty and valid bits (e.g., V1 for data buffer 1) are cleared.

Whenever a write from the system/host occurs (e.g., via the system data bus), the address (e.g., via the system address bus) can be compared against all the BA registers (e.g., BA1, BA2, BA3, . . . BAN). If there is a match for one of the buffers, the data may be written into the byte of that data buffer in buffers 702 that corresponds to the lower bits of the address. Also, the corresponding dirty bit can be set, and the selected buffer's LRU bits may be updated. If there is no match, the next "empty" buffer may be selected for write, the BA of that buffer may be set to the upper bits of the address. Also, if there were less than two "empty" buffers, one of the other buffers can be selected for eviction whereby its data is written to flash memory array 704. A buffer may be considered as "empty" if all the dirty and valid bits are cleared. The algorithm for selecting the buffer for eviction may be based on the LRU bits, random, or any other suitable algorithm.

Figure 8A:
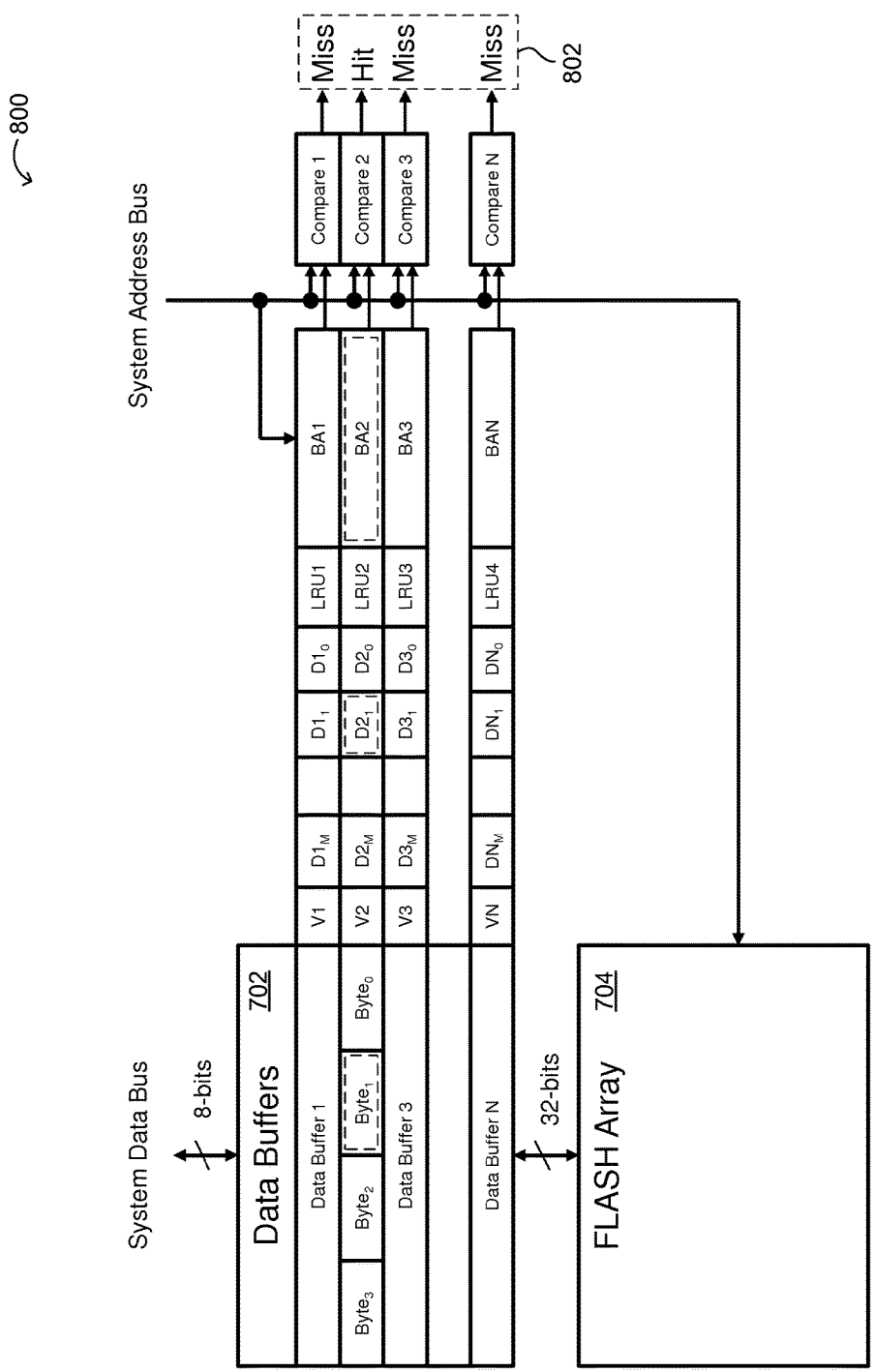
FIGS. 8A and 8B are schematic block diagrams of an example write-hit in a cached flash memory structure, in accordance with embodiments of the present invention.
Figure 8B:
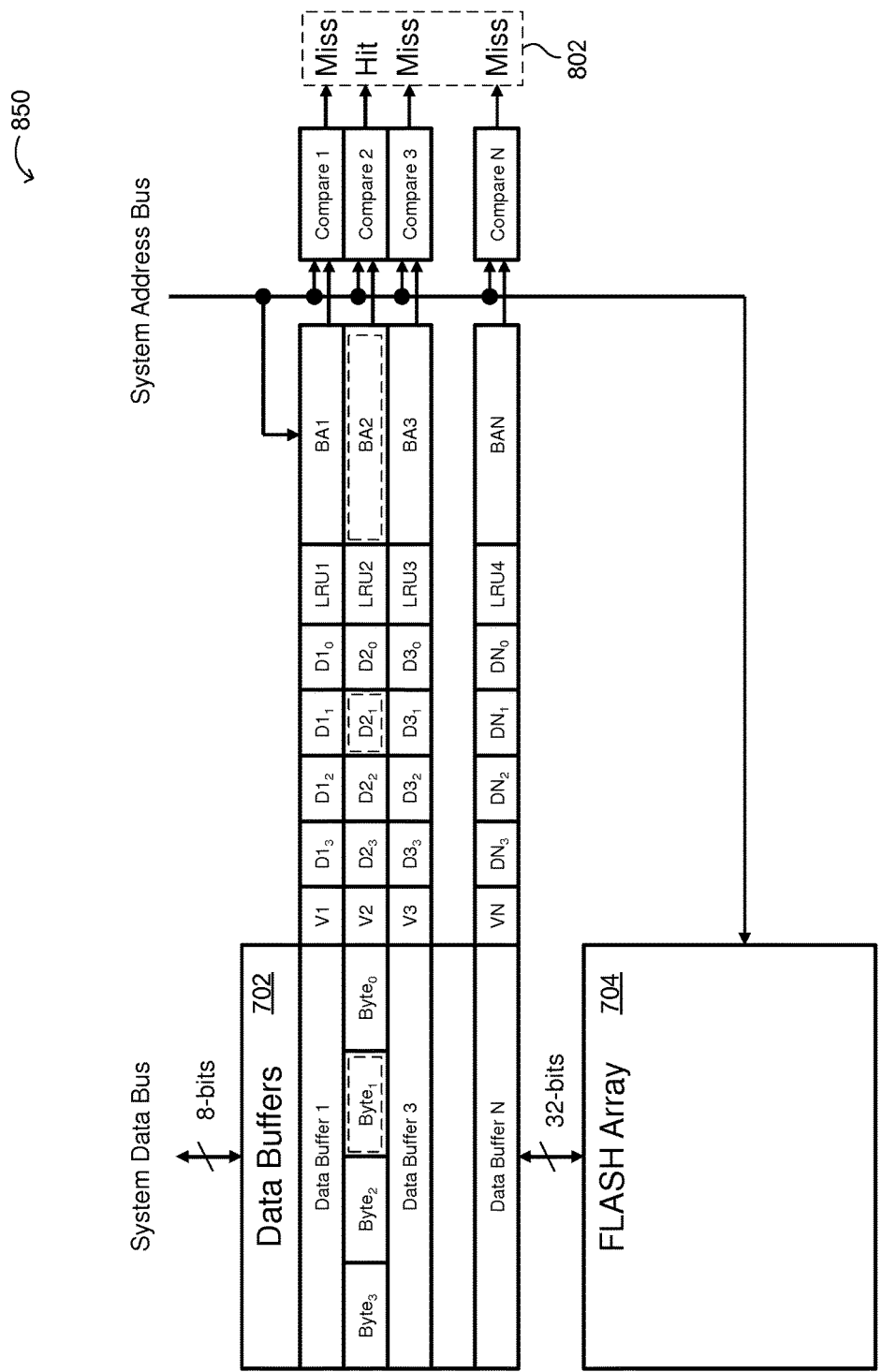

Referring now to FIGS. 8A and 8B, shown are schematic block diagrams 800/850 of an example write-hit in a cached flash memory structure, in accordance with embodiments of the present invention. In this example, bits N−1, N−2 . . . 4, 3, 2 of the system address can match the value of BA2. If bits 1 and 0 of the system address are "01", the data can be written into $Byte_1$ of data buffer 2, dirty bit $D2_1$ may be set, and LRU2 may be set depending on the particular replacement algorithm that is utilized. Thus as shown in 802, the compare circuitry corresponding to data buffer 2 can result in a hit, while the other data buffers result in a miss. Thus, data buffer 2 may correspond to a page of data found in flash memory array 704. Further, only the data in $Byte_1$ of data buffer 2 may be updated in this particular case, and the corresponding dirty bit $D2_1$ may indicate that this data byte is to be updated via a subsequent write to flash memory array 704.

Figure 9A:
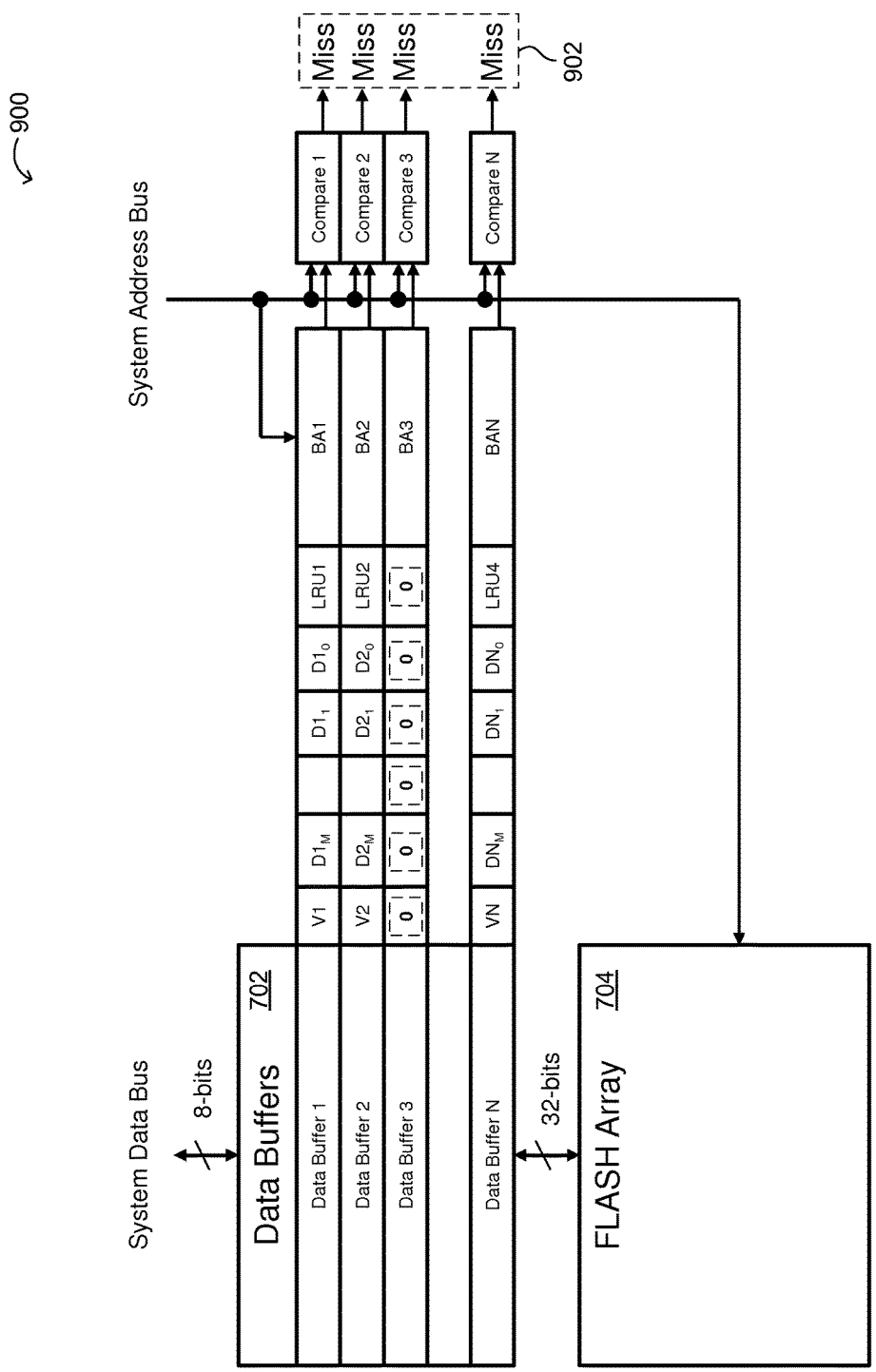
FIGS. 9A and 9B are schematic block diagrams of an example write-miss in a cached flash memory structure, in accordance with embodiments of the present invention.
Figure 9B:
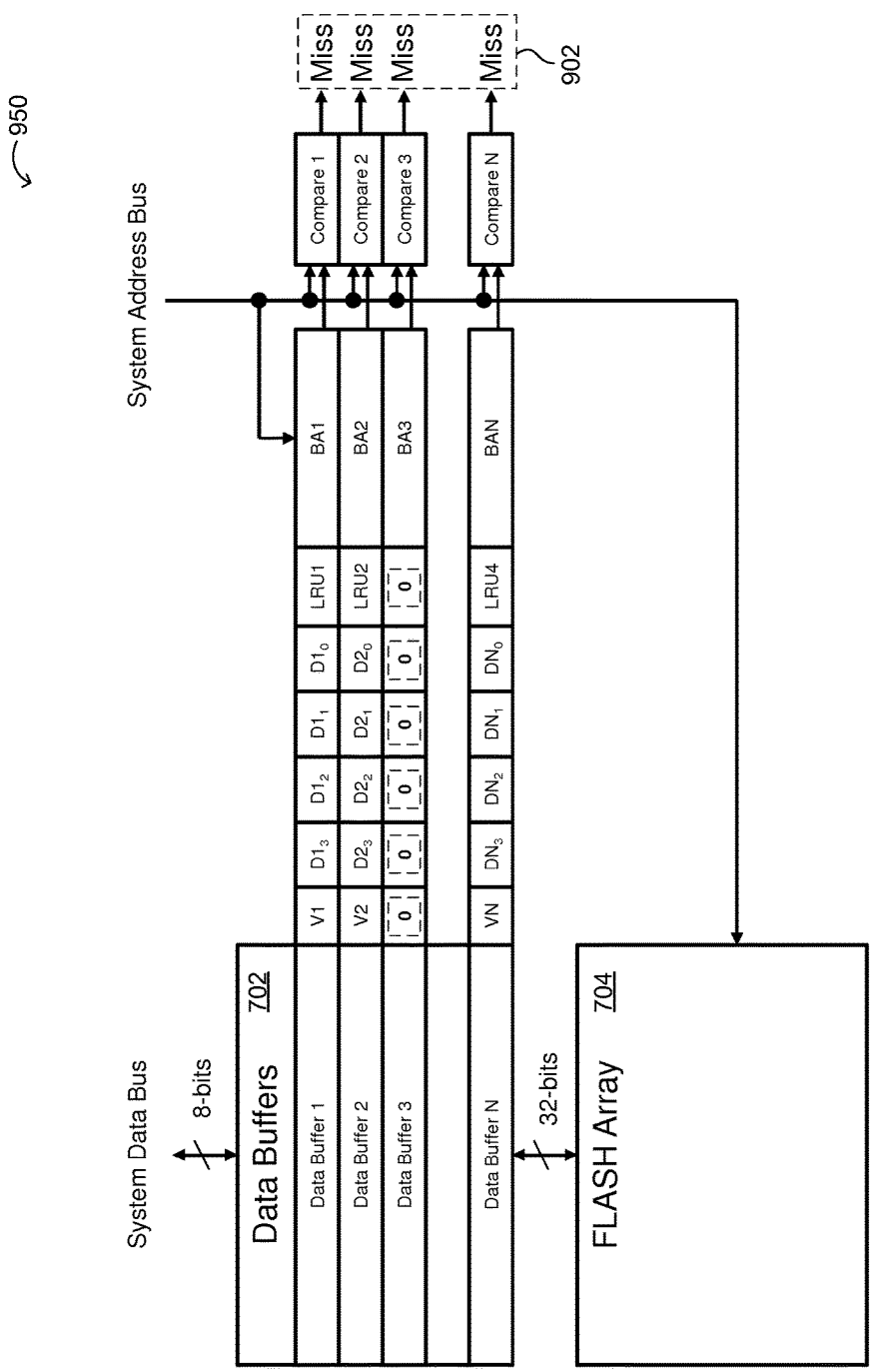

Referring now to FIGS. 9A and 9B, shown are schematic block diagrams 900/950 of an example write-miss in a cached flash memory structure, in accordance with embodiments of the present invention. In this example, bits N−1, N−2 . . . 4, 3, 2 of the system address may not match the value of BA2, or to that of any of the other data buffers in 702, as shown in the miss states in 902. If all the dirty and valid bits of data buffer 3 are clear as shown, BA3 may be set to the value of bits N−1, N−2 . . . 4, 3, 2 of the system address bus, and a suitable write sequence to data buffer 3 may be initiated. In addition, depending on the particular LRU algorithm, one of the other buffers can be selected for eviction. Eviction can include a writing of data from the evicted buffer into flash memory array 704, in order to free up that data buffer for new data to be written therein. The dirty bytes in the selected buffer for eviction can be written (e.g., programmed) into flash memory array 704, the corresponding dirty bits and valid bit may be cleared, and the buffer's LRU may be accordingly updated.

Figure 10A:
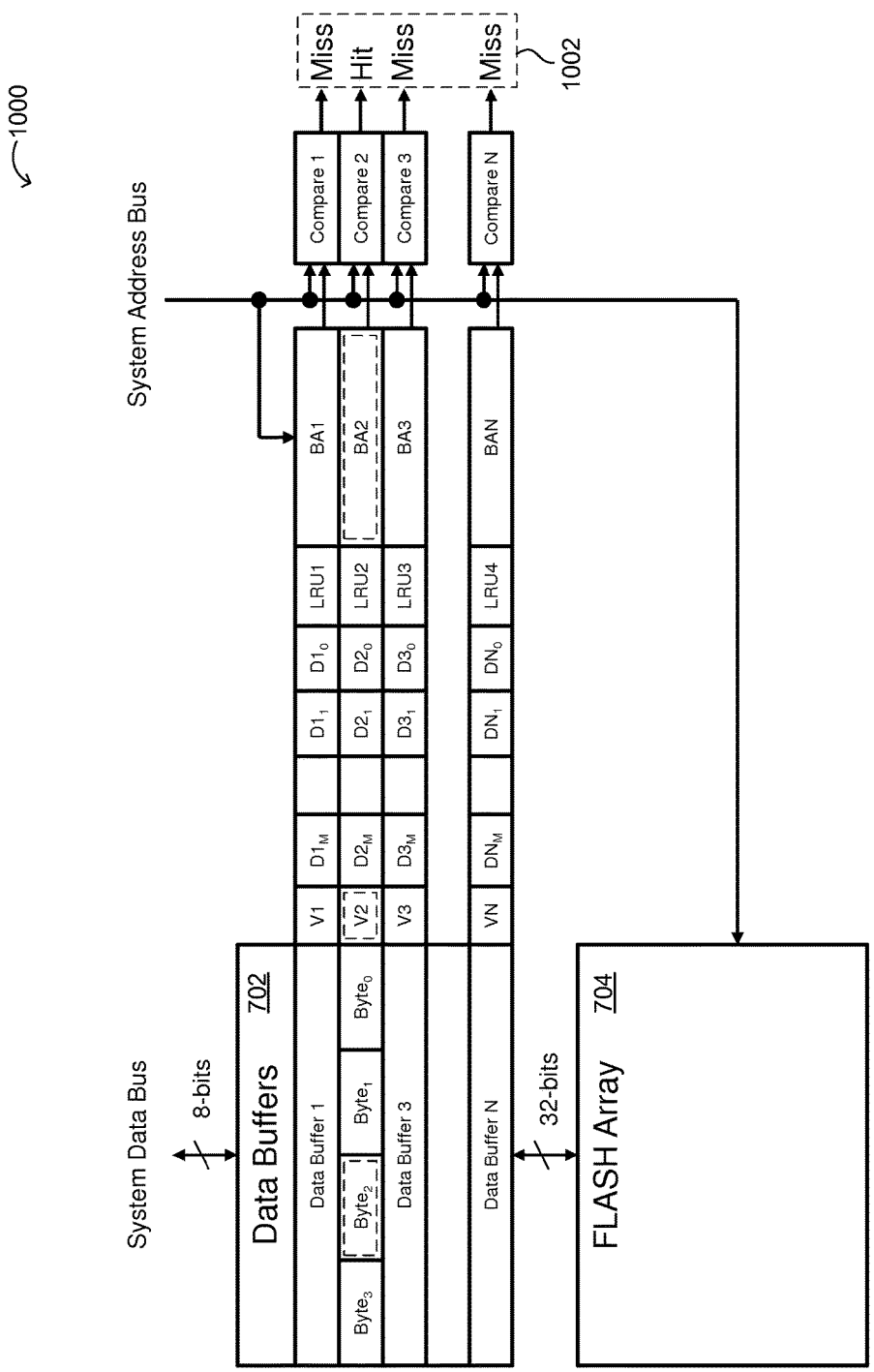
FIGS. 10A and 10B are schematic block diagram of an example read-hit in a cached flash memory structure, in accordance with embodiments of the present invention.
Figure 10B:
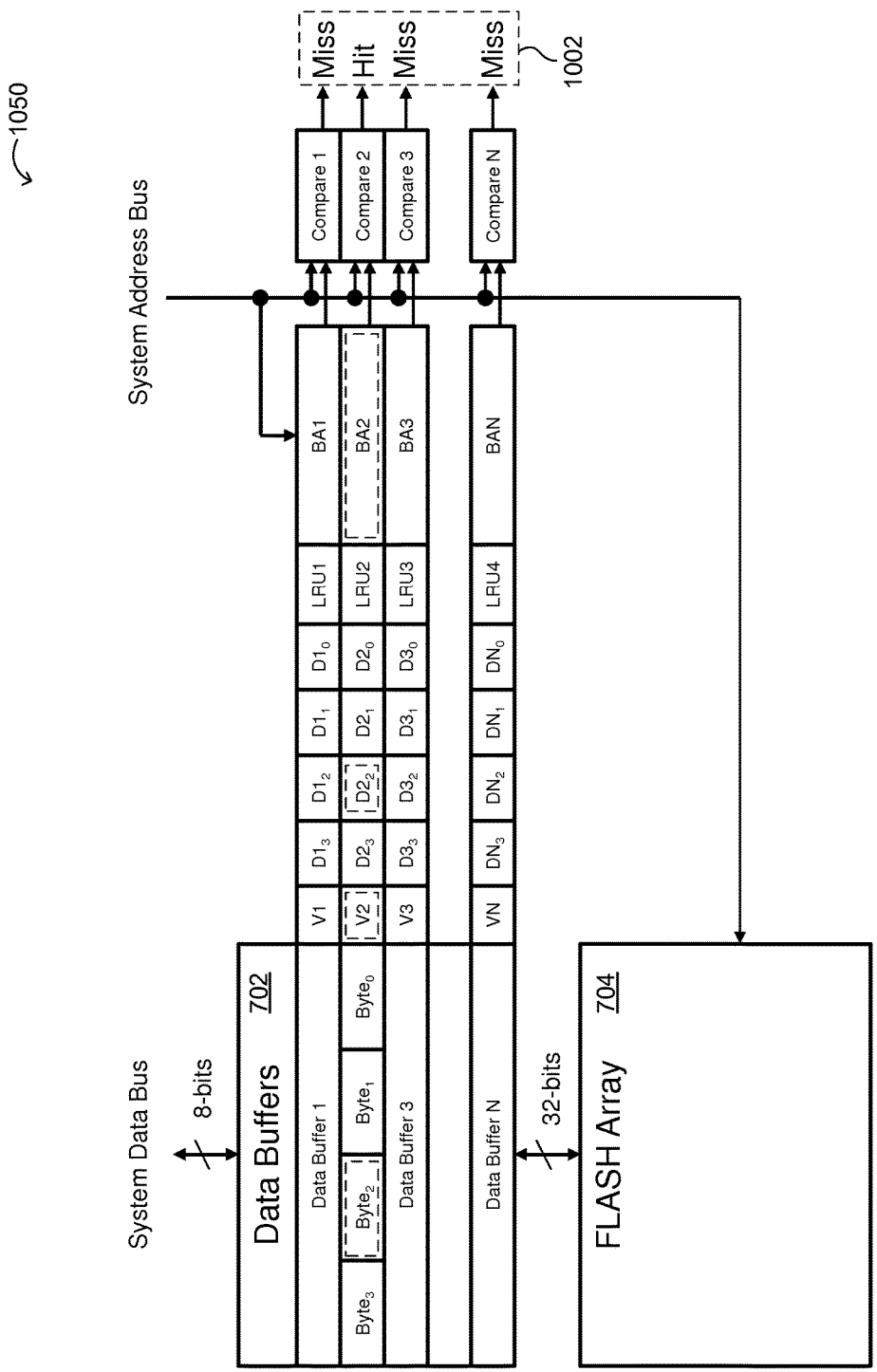

Referring now to FIGS. 10A and 10B, shown are schematic block diagrams 1000/1050 of an example read-hit in a cached flash memory structure, in accordance with embodiments of the present invention. In this example, if bits 1 and 0 of the system address bus are "10" and bits N−1, N−2 . . . 4, 3, 2 of the system address match the value of BA2 resulting in a "hit" in 1002 via the compare circuitry, and if either V2 or the $D2_2$ is set, the data may be read from $Byte_2$ of data buffer 2, and LRU2 may be set (depending on the particular replacement algorithm that is utilized).

If the upper address bits match one of the BA registers, and either the valid bit is set or the byte-specific dirty bit is set, there is a "hit" comparison result, as shown in 1002. If there is a "hit" in one of the buffers 702, the data may be read from the byte of that buffer that corresponds to the lower bits of the address, and the buffer's LRU may be updated. If there is no "hit," indicating that none of data buffers 702 contain the requested data, the data can be read from the byte of flash memory array 704 that corresponds to the address. Alternatively, or in addition, the device may also read the full page from flash memory array 704 into the "empty" buffer, set the corresponding valid bit and BA, and optionally update the buffer's LRU. Also, if there were less than two "empty" buffers, one of the other buffers may be selected for immediate eviction. This operation may be referred to as a "read allocation" operation. Also, the algorithm for selecting the buffer for eviction may be based on the LRU bits, random, or any other suitable approach.

Figure 11A:
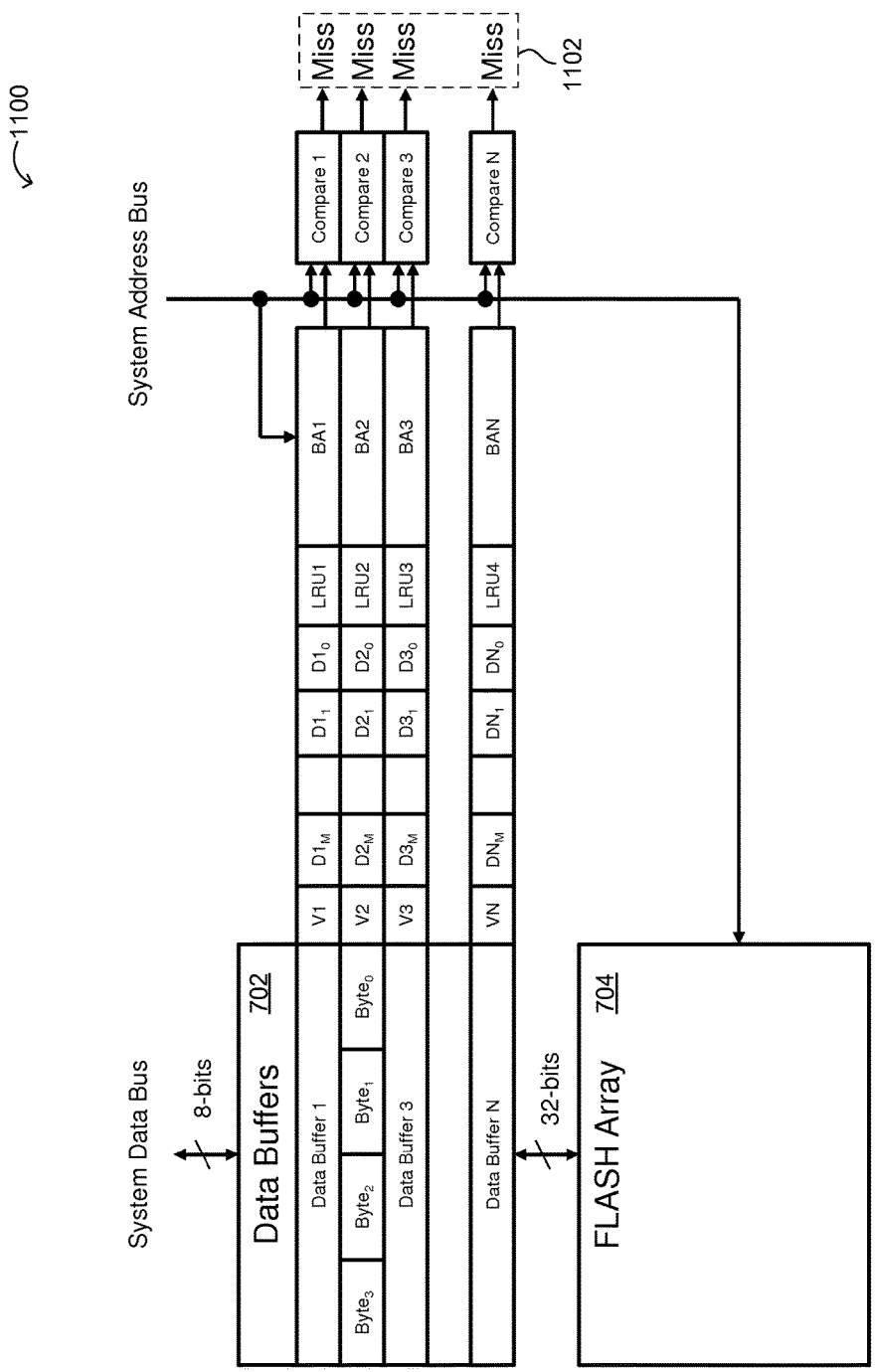
FIGS. 11A and 11B are schematic block diagrams of an example read-miss in a cached flash memory structure, in accordance with embodiments of the present invention.
Figure 11B:
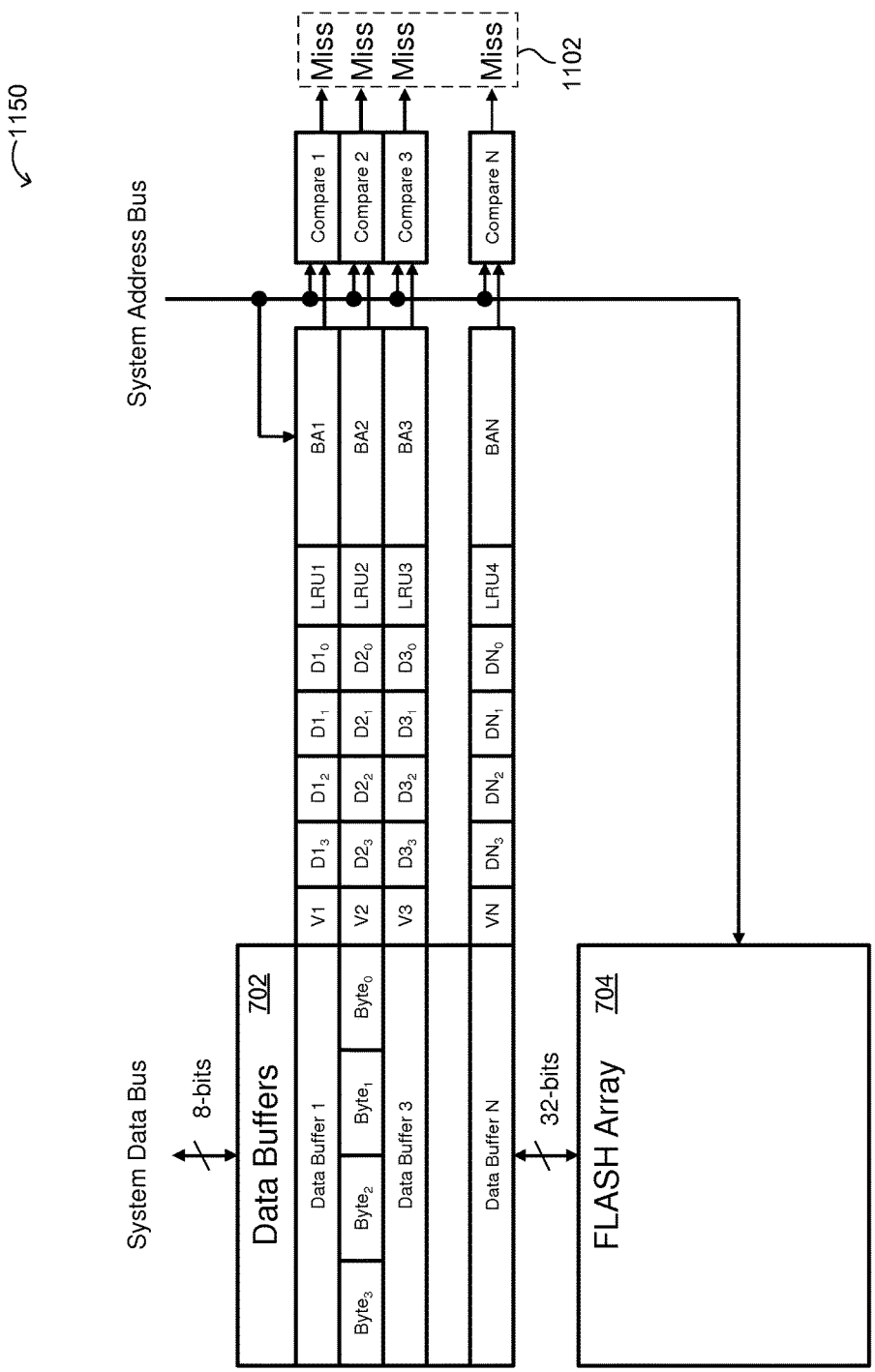

Referring now to FIGS. 11A and 11B, shown are schematic block diagrams 1100/1150 of an example read-miss in a cached flash memory structure, in accordance with embodiments of the present invention. For example, a read miss can occur if bits N−1, N−2 . . . 4, 3, 2 of the system address bus do not match the value of any of the BA values, or if bits N−1, N−2 . . . 4, 3, 2 of the system address match the value of, e.g., BA2, but V2 and the dirty bit corresponding to lower address bits (e.g., bits 1 and 0) of the system address are clear. This is shown in 1102 by the comparison circuitry producing "miss" states for each comparison result. In this case, the requested data can be read from flash memory array 704 and a "read allocation" cycle may be initiated in order to place the requested data into an appropriate of the data buffers 702.

In a system with a relatively large number of buffers, the concurrent address comparisons (e.g., compare 1, compare 2, . . . compare N) may consume a significant amount of power. In a sensor hub system, where most of the buffers may be dedicated to sensors, the power can be reduced in various ways. For example, if addresses of the buffers for the sensors is allocated such that they share many of the most significant bits (MSBs), consecutive accesses from the sensor DMA engines may not toggle these shared address bits, and as a result the XOR gates (or other such logic in the compare circuitry) corresponding to these bits may not toggle. However, these MSB bits may still change at any time due to occurrence of a host-originated transaction. Alternatively, each sensor can be assigned to, e.g., two specific fixed buffers and may address the appropriate buffer directly, thus bypassing the address comparison logic. This can cause comparisons to be done mainly for host-originated transactions, and only for a small subset of data buffers 702.

Figure 12:
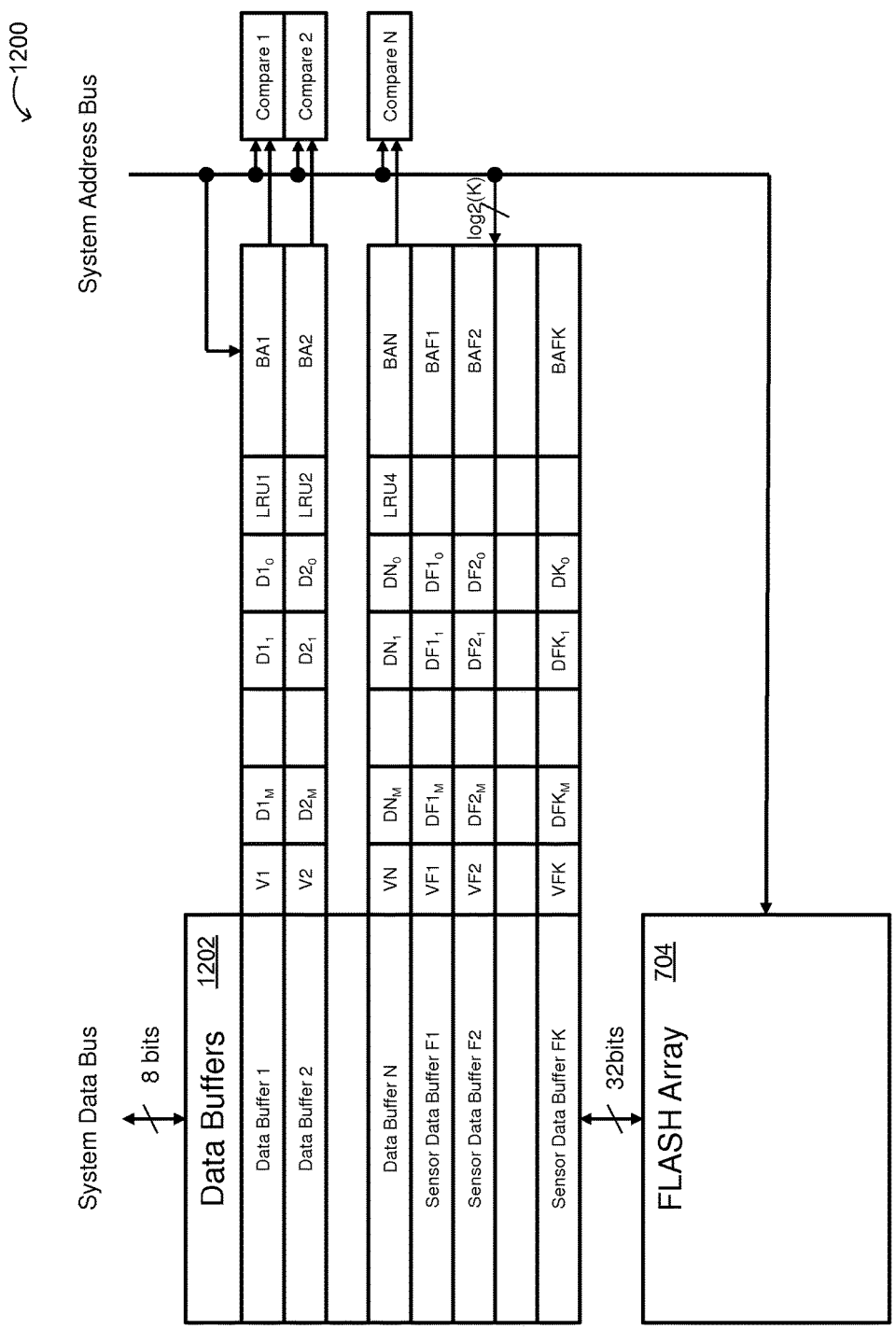
FIG. 12 is a schematic block diagram of an example cache with a fixed buffer support structure, in accordance with embodiments of the present invention.

Referring now to FIG. 12, shown is a schematic block diagram 1200 of an example cache with a fixed buffer support structure, in accordance with embodiments of the present invention. Data buffers 1202 can include additional sensor data buffers F1-FK over those found in example data buffers 702 above. Here, operation may be described with respect to dedicated data buffers F1 through FK, which may be allocated to handle specific sensor data, and the operation of data buffers 1 to N can remain substantially the same as described above with reference to data buffers 702. In one example system with K fixed buffers with M bytes per buffer, $\log_2(M)$ least-significant address bits may be used to access a byte within a specific buffer. Also, $\log_2(K)$ most-significant address bits may be used to access the specific buffer within the cache structure. In addition, the system may include K sensors whereby an output from each sensor is mapped to one sensor data buffer F1-FK.

In a system with K=16 and M=128, the 7 LSB can be used for access within a buffer, while the 4 MSBs can be used to address the buffer within the cache. Whenever a write from the system (e.g., host processor) occurs into the fixed sensor data buffers F1-FK, the buffer address bits of that address may be used to access a specific buffer. Also, the data may be written into the byte of the particular buffer that corresponds to the lower bits of the address, and the corresponding dirty bit can be set. Further, if the byte was the last byte of the buffer, that buffer may be selected for eviction. Particular embodiments can support a wide variety of numbers of buffers, as well as allocations of the buffers (e.g., sensor data, power management related data, etc.).

Figure 13:
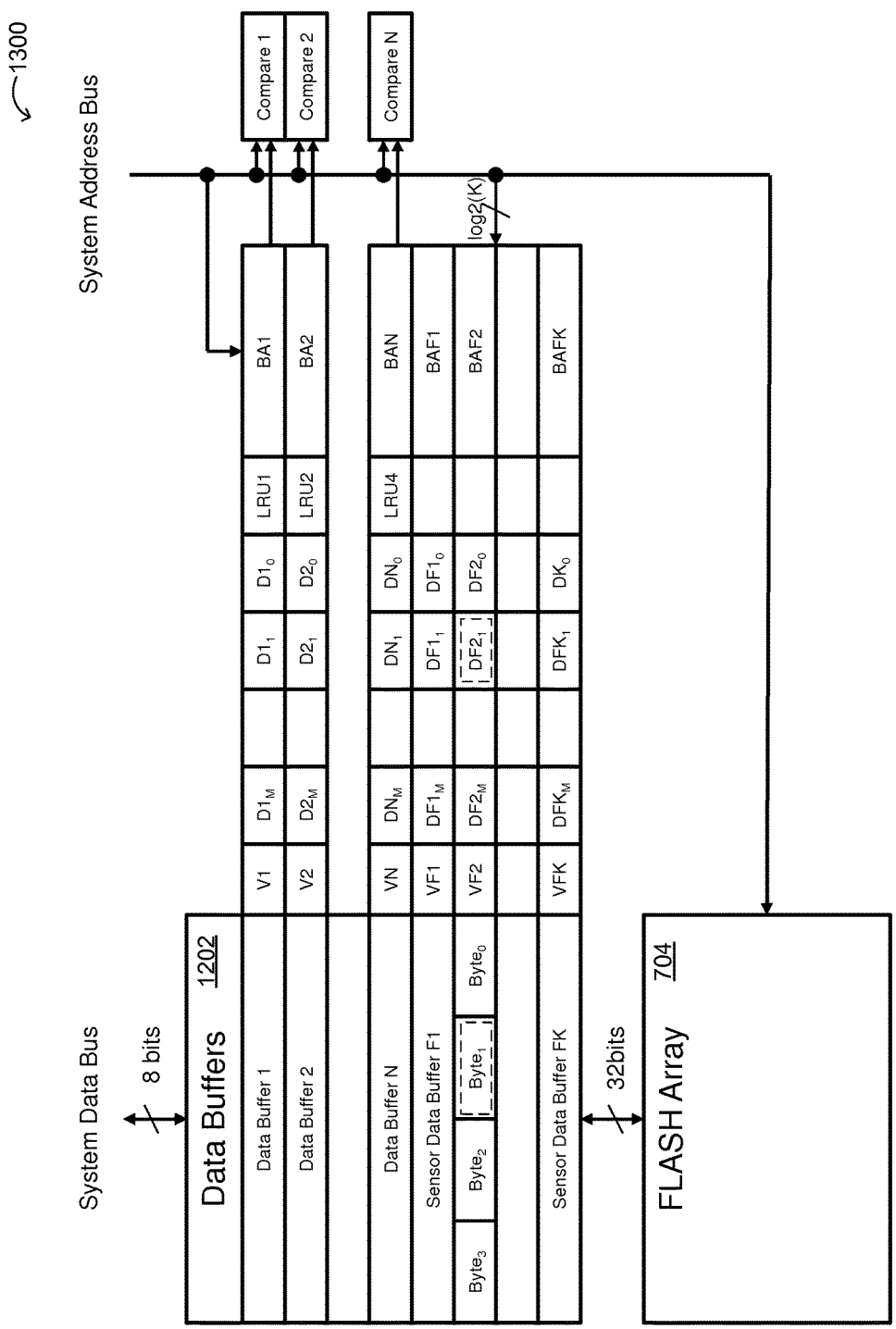
FIG. 13 is a schematic block diagram of an example write operation to a fixed buffer support structure, in accordance with embodiments of the present invention.

Referring now to FIG. 13, shown is a schematic block diagram 1300 of an example write operation to a fixed buffer support structure, in accordance with embodiments of the present invention. In this example, the buffer address bits of the system address are "00 . . . 01," and if $\log_2(M)$ least-significant address bits are "00 . . . 01," the data can be written into $Byte_1$ of data buffer F2, and dirty bit $DF2_1$ may be set. Also, eviction can be performed in the same general fashion as eviction for the non-fixed buffers, as described above. For example, when the eviction is completed, a new value may be written into the BA field of that buffer. That new value may be equal to the old BA plus twice the buffer size, unless that new value is beyond the allocated space in the flash. In that case, the host processor can be notified (e.g., via an interrupt or another suitable notification scheme), and the BA may be set to point to the beginning of that address space such that a cyclic buffer can be maintained.

In some cases, the system can support reads from the fixed buffers, and in other cases, the system may not allow reads from the fixed/dedicated buffers. For cases that do not support of reads from fixed buffers F1-FK, a compare operation can be performed on the non-fixed buffers, and the operation may be substantially identical to the read operation described above. If support for reads from fixed/dedicated buffers F1-FK is provided, the compare operation can be extended to the fixed buffers, but none of these buffers may be selected for eviction in such a read operation.

Figure 14:
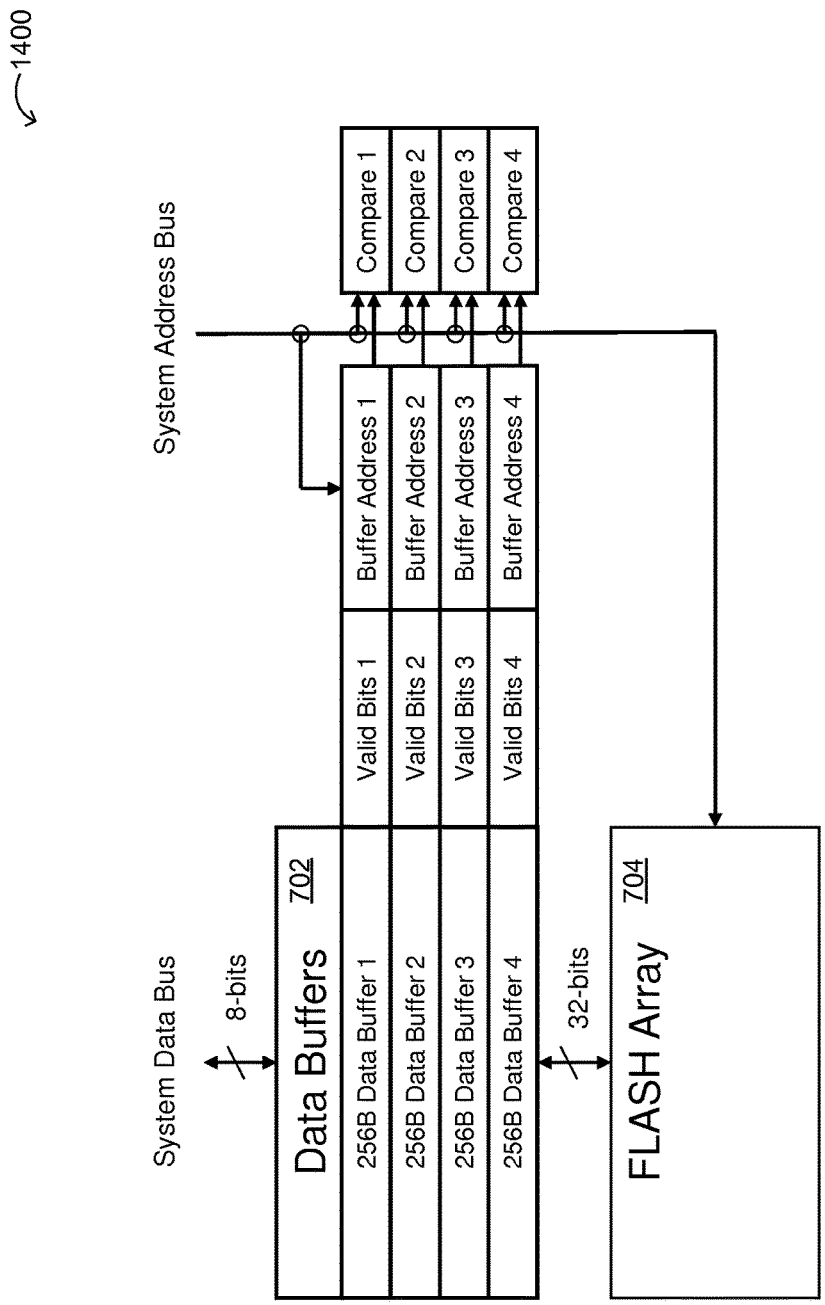
FIG. 14 is a schematic block diagram of example SRAM-based buffering for a cached flash, in accordance with embodiments of the present invention.

Referring now to FIG. 14, shown is a schematic block diagram 1400 of example SRAM-based buffering for a cached flash, in accordance with embodiments of the present invention. An on-chip cache can include data buffers 702 associated valid bits and buffer address registers, and associated compare circuitry, integrated in a same IC as flash memory array 704. Alternatively, or in addition, the data buffers can include fixed/dedicated buffers as shown in example buffers 1202. In any event, such an integrated data buffer arrangement can accommodate more efficient write operations, as compared to conventional approaches.

Autonomous SRAM-based buffering can be utilized to reduce power consumption. Also in particular embodiments, various housekeeping operations can be automatically performed in order to substantially eliminate the need for explicit buffer management. Further, a streamlined programming model can shorten firmware development cycle time. Certain embodiments can also accommodate the CPU/MCU or host processor being placed in a power down mode while data is transferred from data buffers 702 into flash memory array 704. In this particular example, valid bits 1-4 and buffer addresses 1-4 can correspond to data buffers (e.g., 256B each) 1-4 of buffers 702.

In example operation, writes can be gathered into the 256B-sized buffers together with the target address in flash memory array 704. In this particular arrangement, data buffers in 702 can automatically be written into flash memory array 704 under various conditions. For example, when one of the data buffers in 702 become full, that data can be written into the appropriate location in flash memory array 704. As another example, when one of the data buffers in 702 needs to be replaced (evicted), that data can be written into the appropriate location in flash memory array 704. In another example the data from one of data buffers in 702 can be written into flash memory away 704 in response to a command or appropriate notification from the CPU/MCU or host processor. Also, when requested read data resides in a buffer of 702, the selected buffer can provide the requested data on the system data bus. If the requested read data does not reside in a data buffer in 702, the requested data can be read from flash memory array 704, and in which case the data may also be provided to an allocated data buffer.

In one embodiment, a method of controlling a write operation in a cached memory device, can include: (i) comparing a system address bus against a plurality of buffer address registers, where each buffer address register corresponds to one of a plurality of data buffers; (ii) selecting one of the data buffers in response to a hit from the comparing; (iii) allocating a data buffer as the selected buffer in response to all misses from the comparing; (iv) writing data from a system data bus to the selected data buffer; and (v) writing the data previously written into the selected data buffer to a memory array via an internal data bus.

Figure 15:
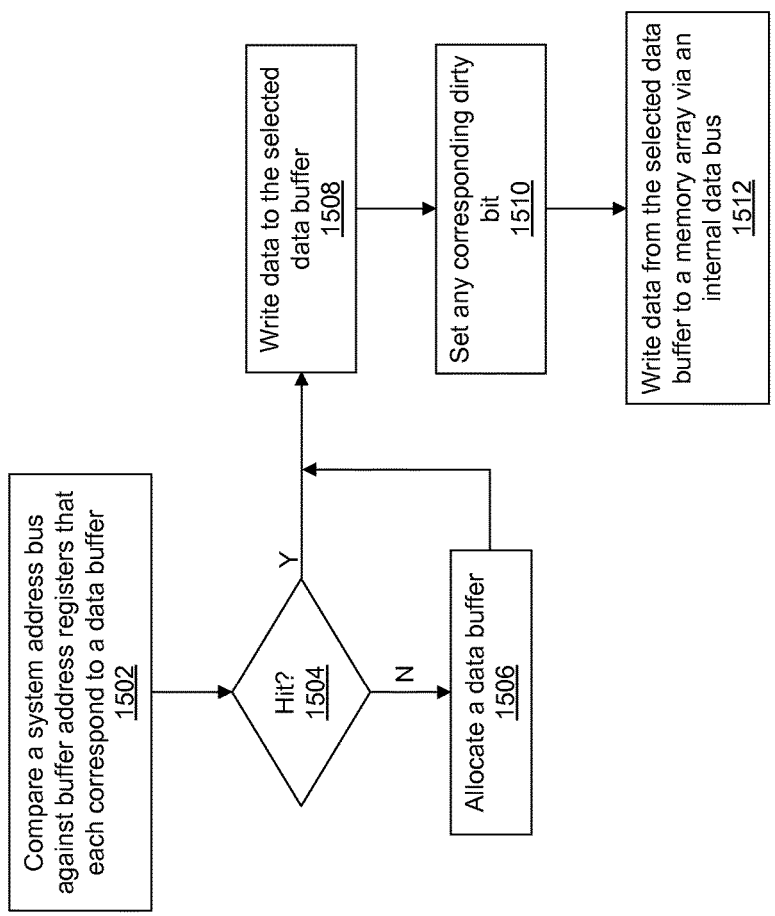
FIG. 15 is a flow diagram of an example write operation in a cached flash device, in accordance with embodiments of the present invention.

Referring now to FIG. 15, shown is a flow diagram 1500 of an example write operation in a cached flash device, in accordance with embodiments of the present invention. At 1502, a system address bus can be compared (e.g., via compare circuitry) against buffer address registers. For example, the comparison can be as to upper level address bits, and each buffer address register may correspond to a data buffer. The comparison can result in a "hit" or "miss" status for each comparison. If a comparison result is a hit status at 1504 for a given corresponding buffer, that buffer can be selected for access. If however, each comparison result in a miss status at 1504, a data buffer can be allocated as the selected buffer at 1506. For example, this allocation can include considering LRU fields associated with the data buffers. In addition, the allocation of a given data buffer can result in eviction of the previous data in that buffer, which can include writing that data into flash memory array 704.

At 1508, data can be written from a system data bus to the selected data buffer. In addition, a corresponding dirty bit (e.g., corresponding to a byte of data in one of the data buffers) can be set at 1510. In some cases, dirty bits may not be employed, and step 1510 may thus be considered optional. In any event, at some point, the data previously written into the selected data buffer can be written to a memory array (e.g., 704) via an internal data bus at 1512. In some cases, the writing of the memory array can occur at a much later time, and may be based on various factors (e.g., eviction of the given data buffer, a power down management situation, etc.). Also, in order to determine that the present operation is a write operation, command decode 120 can be employed and/or other indications from the CPU/MCU or host processor can be utilized.

In one embodiment, a method of controlling a read operation in a cached memory device, can include: (i) comparing a system address bus against a plurality of buffer address registers, where each buffer address register corresponds to one of a plurality of data buffers; (ii) selecting one of the data buffers in response to a hit from the comparing; (iii) determining if valid/dirty bits are set for the selected data buffer; (iv) reading data from the selected data buffer onto a system data bus if the valid/dirty bits are set; and (v) reading data from the memory array via the internal data bus in response to at least one of: all misses from the comparing, and the valid/dirty bits being reset.

Figure 16:
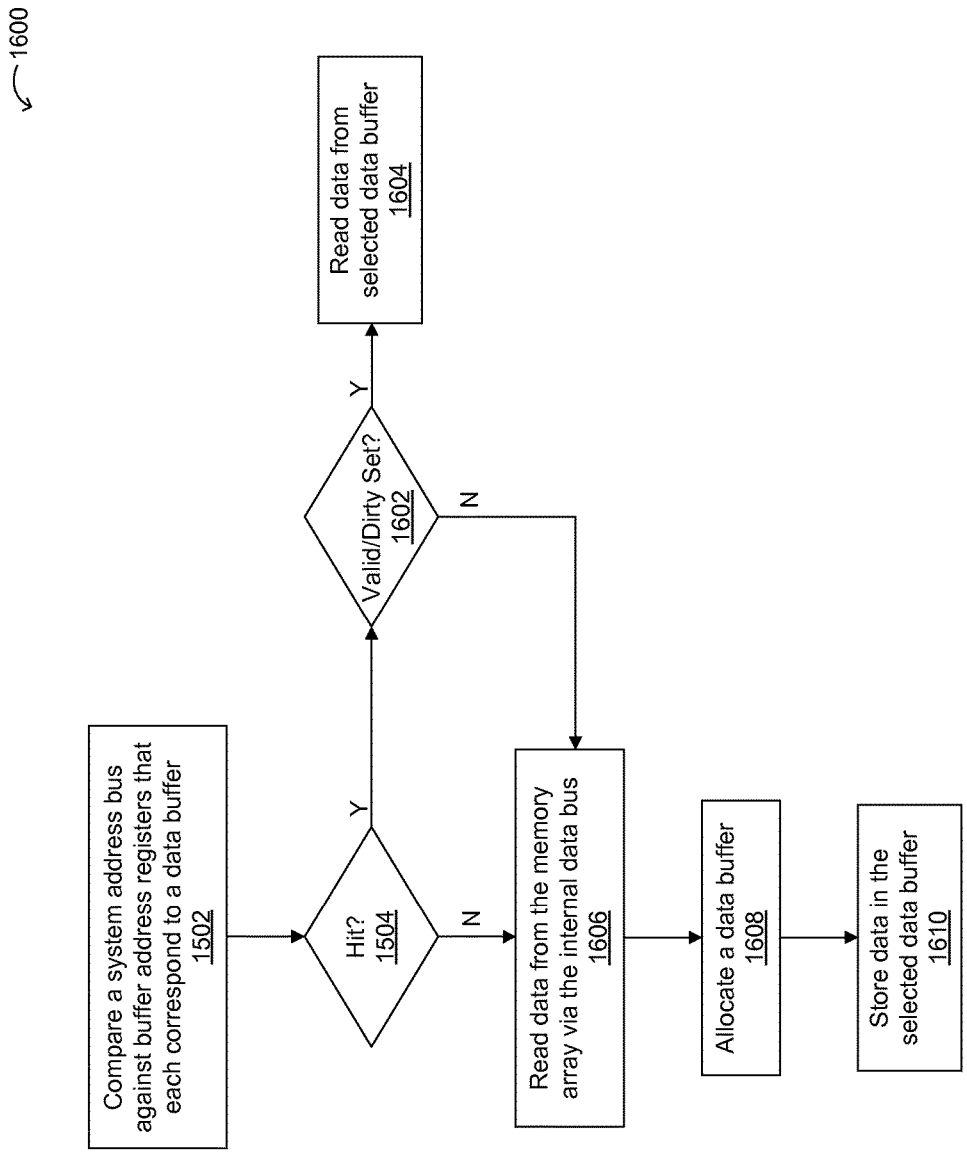
FIG. 16 is a flow diagram of an example read operation in a cached flash device, in accordance with embodiments of the present invention.

Referring now to FIG. 16, shown is a flow diagram 1600 of an example read operation in a cached flash device, in accordance with embodiments of the present invention. At 1502, a system address bus can be compared (e.g., via compare circuitry) against buffer address registers. For example, the comparison can be as to upper level address bits, and each buffer address register may correspond to a data buffer. The comparison can result in a "hit" or "miss" status for each comparison. If a comparison result is a hit status at 1504 for a given corresponding buffer, that buffer can be selected for access.

However, the data found in the selected buffer may not be appropriate for reading. As such, the valid and/or dirty bits can be checked to determine if the selected buffer is valid, and/or if the data found in the buffer is the proper or newest data to read, as may be indicated by the dirty bits. Depending on the particular data buffers and associated bits that are employed in a given case, dirty bits may not be utilized. Thus, as used herein, "valid/dirty" can indicate valid and/or dirty bits. If at 1602, the valid/dirty bits are set, data can be read from the selected data buffer onto the system data bus at 1604.

If however, each comparison result in a miss status at 1504, or if the valid/dirty bits are reset at 1602, data can be read from the memory array via the internal data bus at 1606. In some cases, a data buffer may be allocated at 1608, in response to a miss status comparison result. For example, this allocation can include considering LRU fields associated with the data buffers. In addition, the allocation of a given data buffer can result in eviction of the previous data in that buffer, which can include writing that data into flash memory array 704. In the case of a buffer being allocated, data read from the flash memory array can be stored in the selected data buffer at 1610. It should be noted that, if there was a selected buffer from due to a "hit" comparison result, but the valid/dirty bits are reset, a new buffer may need not be allocated. Rather, the data in the buffer can be updated with data from the flash memory array, and the appropriate valid/dirty bits may then be set.

Resistive switching memory cells as discussed herein may also each support more than one memory state in some cases. In addition, depending on the voltage level controls, instead of a full erase or a full program/write, partial operations (e.g., by applying less/predetermined voltages for forward bias and reverse bias of the CBRAM cell, by applying different program current, etc.) can be performed. Such partial operations can produce different resistance and linear/nonlinear values in the cell, as opposed to the cell having an on/off resistance corresponding to two storage states. Instead, a binary coding of, e.g., eight different bands or ranges of CBRAM cell on resistances can be converted into 3-bit storage values. Thus in this example, eight different data values can be stored in a given CBRAM cell. Of course, other numbers of data values can be stored based on the resistance, linearity, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A cached memory device, comprising:
   a) a memory array coupled to a system address bus and an internal data bus;
   b) a plurality of data buffers coupled to a write data path of a system data bus, and to the memory array via a write data path of the internal data bus, wherein the system data bus and the internal data bus are both bidirectional data busses;
   c) a plurality of valid bits, wherein each valid bit corresponds to one of the data buffers;
   d) a plurality of buffer address registers coupled to the system address bus, wherein each buffer address register corresponds to one of the data buffers;
   e) a plurality of compare circuits coupled to the system address bus, wherein each compare circuit corresponds to one of the data buffers such that there is a same number of the compare circuits, the buffer address registers, and the data buffers;
   f) a power down circuit configured to detect a loss of power to the cached memory device; and
   g) a write buffer controller configured to evict, in response to the detected loss of power, at least one of the plurality of data buffers by writing contents of the evicted data buffer into the memory array via the write data path of the internal data bus.

2. The cached memory device of claim 1, further comprising a plurality of programmable lock bits, wherein each programmable lock bit corresponds to one of the data buffers, and wherein the corresponding data buffer is excluded from eviction when the programmable lock bit is active.

3. The cached memory device of claim 1, wherein the compare circuits are configured to compare an address via the system address bus against each address stored in the plurality of buffer address registers, and to generate a hit or a miss indication from each comparison.

4. The cached memory device of claim 3, wherein:
a) one of the data buffers is configured to be selected in response to the hit indication; and
b) a byte of the selected data buffer that corresponds to lower bits of the system address bus is configured to be written with data from the system data bus in response to a write command.

5. The cached memory device of claim 3, wherein:
a) one of the data buffers is configured to be selected in response to the hit indication; and
b) a byte of the selected data buffer that corresponds to lower bits of the system address bus is configured to be read onto the system data bus in response to a read command and valid and dirty bits being set.

6. The cached memory device of claim 3, wherein the address via the system bus is simultaneously compared against each address stored in the plurality of buffer address registers.

7. The cached memory device of claim 1, further comprising a plurality of dirty bits, wherein each dirty bit corresponds to a byte of one of the data buffers.

8. The cached memory device of claim 7, wherein one of the dirty bits is set in response to the corresponding byte being written.

9. The cached memory device of claim 8, wherein the corresponding byte having the set dirty bit is configured to be written to the memory array via the internal data bus.

10. The cached memory device of claim 1, further comprising a plurality of least recently used (LRU) fields, wherein each LRU field corresponds to one of the data buffers.

11. The cached memory device of claim 10, wherein one of the data buffers is configured to be evicted based on a corresponding of the LRU fields.

12. The cached memory device of claim 1, wherein:
a) the memory array comprises flash memory; and
b) each of the plurality of data buffers comprises static random access memory (SRAM).

13. The cached memory device of claim 1, wherein only contents of dirty bytes of the evicted data buffer are written into the memory array.

14. The cached memory device of claim 1, wherein the write buffer controller is further configured to evict, in response to the plurality of data buffers being full, at least one of the plurality of data buffers by writing contents of the evicted data buffer into the memory array.

15. The cached memory device of claim 1, wherein the write buffer controller is further configured to evict, in response to a command from a host processor, at least one of the plurality of data buffers by writing contents of the evicted data buffer into the memory array.

16. The cached memory device of claim 1, further comprising a plurality of dedicated data buffers, wherein each of the dedicated data buffers corresponds to a sensor.

17. A method of controlling a write operation in a cached memory device, the method comprising:
a) comparing, by a plurality of compare circuits, an address via a system address bus against each address stored in a plurality of buffer address registers, wherein each buffer address register corresponds to one of a plurality of data buffers such that there is a same number of the compare circuits, the buffer address registers, and the data buffers;
b) selecting one of the plurality of data buffers that corresponds to the buffer address register matching the address via the system address bus in response to a hit from the comparing;
c) allocating one of the plurality of data buffers as the selected buffer in response to all misses from the comparing;
d) writing data from a system data bus to the selected data buffer;
e) writing the data previously written into the selected data buffer via an internal data bus to a memory array matching the address via the system address bus, wherein the plurality of data buffers are coupled to a write data path of the system data bus, and to the memory array via a write data path of the internal data bus, wherein the system data bus and the internal data bus are both bidirectional data busses;
f) detecting, by a power down circuit, whether a loss of power to the cached memory device is occurring; and
g) evicting, by a write buffer controller in response to the detected loss of power, at least one of the plurality of data buffers by writing contents of the evicted data buffer into the memory array via the write data path of the internal data.

18. The method of claim 17, further comprising:
a) updating a least recently used (LRU) field corresponding to the selected data buffer; and
b) setting a corresponding dirty bit, wherein the allocating the data buffer comprises evicting one of the data buffers.

19. The method of claim 17, wherein the evicting by the write buffer controller in response to the detected loss of power is performed only if a corresponding programmable lock bit is inactive.

20. A method of controlling a read operation in a cached memory device, the method comprising:
a) comparing, by a plurality of compare circuits, an address via a system address bus against each address stored in a plurality of buffer address registers, wherein each buffer address register corresponds to one of a plurality of data buffers such that there is a same number of the compare circuits, the buffer address registers, and the data buffers;
b) selecting one of the plurality of data buffers that corresponds to the buffer address register matching the address via the system address bus in response to a hit from the comparing;
c) determining if valid/dirty bits are set for the selected data buffer;
d) excluding the selected data buffer from eviction if a corresponding programmable lock bit is active;
e) reading data from the selected data buffer onto a system data bus if the valid/dirty bits are set;
f) reading data via an internal data bus from a memory array matching the address via the system address bus in response to at least one of: all misses from the comparing, and the valid/dirty bits being reset, wherein the plurality of data buffers are coupled to a write data path of the system data bus, and to the memory array via a write data path of the internal data bus, wherein the system data bus and the internal data bus are both bidirectional data busses;

g) detecting, by a power down circuit, whether a loss of power to the cached memory device is occurring; and h) evicting, by a write buffer controller in response to the detected loss of power, at least one of the plurality of data buffers by writing contents of the evicted data buffer into the memory array via the write data path of the internal data bus.

\* \* \* \* \*